United States Patent
Yu et al.

(10) Patent No.: US 12,063,113 B2
(45) Date of Patent: Aug. 13, 2024

(54) CODING AND MODULATION METHOD, DEMODULATION AND DECODING METHOD, APPARATUS, AND DEVICE

(71) Applicant: HUAWEI TECHNOLOGIES CO., LTD., Guangdong (CN)

(72) Inventors: Tianhang Yu, Hangzhou (CN); Gongzheng Zhang, Hangzhou (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 318 days.

(21) Appl. No.: 17/535,532

(22) Filed: Nov. 24, 2021

(65) Prior Publication Data

US 2022/0085914 A1    Mar. 17, 2022

Related U.S. Application Data

(63) Continuation of application No. PCT/CN2020/088774, filed on May 6, 2020.

(30) Foreign Application Priority Data

May 31, 2019    (CN) .......................... 201910468056.2

(51) Int. Cl.
*H04L 1/00*    (2006.01)
*H03M 13/25*    (2006.01)

(52) U.S. Cl.
CPC ........ *H04L 1/0058* (2013.01); *H03M 13/251* (2013.01); *H04L 1/0003* (2013.01);
(Continued)

(58) Field of Classification Search
CPC ... H04L 1/0058; H04L 1/0003; H04L 1/0041; H04L 1/0043; H04L 1/005; H04L 1/0071;
(Continued)

(56) References Cited

U.S. PATENT DOCUMENTS

2015/0091742 A1    4/2015  Ionita et al.
2017/0366299 A1*  12/2017  Li .................. H04L 27/2602
2018/0083736 A1*   3/2018  Manolakos ........... H04L 5/0007

FOREIGN PATENT DOCUMENTS

CN    103001729 A    3/2013
CN    104243086 A    12/2014
(Continued)

OTHER PUBLICATIONS

Lampe L H-J et al: "Noncoherent Coded Modulation Forfading Channels",AEU—International Journal of Electronics Andcommunications, Elsevier, Amsterdam, NL,vol. 54, No. 6, Jan. 1, 2000 (Jan. 1, 2000), pp. 399-411,XP000970472,ISSN: 1434-8411.
(Continued)

*Primary Examiner* — Brian J. Gillis
*Assistant Examiner* — Chhian (Amy) Ling
(74) *Attorney, Agent, or Firm* — HUAWEI TECHNOLOGIES CO., LTD.

(57) ABSTRACT

Embodiments of this application provide a coding and modulation method, a demodulation and decoding method, an apparatus, and a device. The coding and modulation method includes obtaining K to-be-encoded bits and a modulation scheme, and coding the K to-be-encoded bits, based on M bit levels of the modulation scheme, to obtain M' code blocks, where M'<M, a code length of an $i^{th}$ code block is $N_i$, $N_i = M_i * N$, $M_i$ is a quantity of bit levels corresponding to the $i^{th}$ code block, N is a symbol block length, and $1 \leq i \leq M'$. The disclosed method further includes modulating the M' code blocks, according to a mapping relationship between the M' code blocks and the M bit levels, to obtain and output a modulated symbol sequence, where a code block whose code length is $M_i * N$ corresponds to $M_i$ bit levels in the mapping relationship.

20 Claims, 10 Drawing Sheets

(52) U.S. Cl.
CPC .......... *H04L 1/0041* (2013.01); *H04L 1/0043* (2013.01); *H04L 1/005* (2013.01); *H04L 1/0071* (2013.01)

(58) Field of Classification Search
CPC ............... H04L 27/186; H04L 27/3427; H04L 27/3488; H04L 1/0045; H04L 1/0057; H03M 13/251
See application file for complete search history.

(56) References Cited

FOREIGN PATENT DOCUMENTS

| CN | 107508661 A | 12/2017 |
|---|---|---|
| CN | 109600194 A | 4/2019 |
| EP | 3264613 A1 | 1/2018 |
| EP | 3443677 A1 | 2/2019 |
| JP | H02291744 A | 12/1990 |
| JP | 2018164288 A | 10/2018 |
| WO | 2018192640 A1 | 10/2018 |

OTHER PUBLICATIONS

Nguyen T T et al: "Rateless Multilevel Coding and Applications",Global Telecommunications Conference, 2009. GLOBECOM2009. IEEE, IEEE, Piscataway, NJ, USA, Nov. 30, 2009(Nov. 30, 2009), pp. 1-7, XP031645847,ISBN: 978-1-4244-4148-8.

U. Wachsmann et al: "Multilevel codes: theoretical concepts and practicaldesign rules",IEEE Transactions on Information Theory, vol. 45, No. 5, Jul. 1, 1999 (Jul. 1, 1999), pp. 1361-1391, XP055273773,USAISSN: 0018-9448, DOI: 10.1109/18.771140.

Yoda Daiki et al., "Performance Comparison of LDPC Coded Modulation Schemes for APSK Signaling," IEICE Technical Report, vol. 111, No. 94, pp. 147-152, 2011,total:6pages.

Trung Thanh Nguyen, Lutz Lampe, "Coded Pulse-Position Modulation for Free-Space Optical Communications," IEEE International Conference on Communications, 2009,total:6pages.

Lutz H.-J. Lampe and Robert F.H. Fischer, "Noncoherent Coded Modulation for Fading Channels," International Journal of Electronics and Communications, vol. 54, No. 6, pp. 399-411, 2000,total:13pages.

Udo Wachsmann et al., "Multilevel codes: theoretical concepts and practical design rules," IEEE Transactions on Information Theory, vol. 45, No. 5, pp. 1361-1391, 1999,total:31pages.

Trung Thanh Nguyen and Lutz Lampe, "Rateless Multilevel Coding and Applications," GLOBECOM 2009-2009 IEEE Global Telecommunications Conference, 2010,total:7pages.

Samsung, Transmission and reception for high-order modulation with MIMO, R1-1714494, 3GPP TSG RAN WG1 Meeting #90, Prague, Czech, Aug. 21-25, 2017, 6 pages.

Kai Chen, Research on Polar Coding Theory and Practical Applications, Information Science and Technology Series of Full-text Database of Chinese Doctoral Dissertations, 2015, Issue 04, 152 pages.

Onurcan iscan et al, Shaped Polar Codes for Higher Order Modulation, IEEE Communications Letters, vol. 22, No. 2, Feb. 2018, 4 pages.

* cited by examiner

CODING AND MODULATION METHOD, DEMODULATION AND DECODING METHOD, APPARATUS, AND DEVICE

CROSS-REFERENCE TO RELATED APPLICATIONS

This application is a continuation of International Patent Application No. PCT/CN2020/088774 filed on May 6, 2020, which claims priority to Chinese Patent Application No. 201910468056.2, filed on May 31, 2019. The disclosures of the aforementioned applications are hereby incorporated by reference in their entireties.

TECHNICAL FIELD

This application relates to the field of communications technologies, and in particular, to a coding and modulation method, a demodulation and decoding method, an apparatus, and a device.

BACKGROUND

In the field of communications technologies, a communications device (for example, a terminal device or a base station) may perform channel coding and decoding by using a polar code.

In a conventional technology, a transmit end usually performs coding by using a multi-level coded (MLC) modulation scheme. M bit levels corresponding to a modulation scheme may be first determined, and to-be-encoded bits are encoded based on a length of a symbol block, to obtain M code blocks. The M code blocks are respectively mapped to the M bit levels, and are transmitted on a channel after modulation. However, in the foregoing process, each code block is independently encoded. When there are a large quantity of bit levels, there are a large quantity of code blocks obtained through encoding. As a result, coding complexity is comparatively high.

SUMMARY

This application provides a coding and modulation method, a demodulation and decoding method, an apparatus, and a device, to reduce coding complexity.

According to a first aspect, an embodiment of this application provides a coding and modulation method. The method may include: obtaining K to-be-encoded bits and a modulation scheme, and encoding the K to-be-encoded bits based on M bit levels of the modulation scheme, to obtain M' code blocks; and modulating the M' code blocks according to a mapping relationship between the M' code blocks and the M bit levels, to obtain and output a modulated symbol sequence, where a code block whose code length is $M_i*N$ corresponds to $M_i$ bit levels in the mapping relationship; $M'<M$, a code length of an $i^{th}$ code block is $N_i$, and $N_i=M_i*N$; $M_i$ is a quantity of bit levels corresponding to the $i^{th}$ code block, N is a symbol block length, i is an integer from 1 to M', and $\Sigma_{i=1}^{i=M'}(M_i)=M$; a quantity of information bits included in the $i^{th}$ code block is $K_i$, and $\Sigma_{i=1}^{i=M'}(K_i)=K$; and K, M, M',N, $N_i$, $M_i$, and $K_i$ are all positive integers.

In the foregoing process, when the K to-be-encoded bits are encoded and modulated, the K to-be-encoded bits are encoded based on the M bit levels of the modulation scheme, to obtain the M' code blocks. The M' code blocks are modulated according to the mapping relationship between the M' code blocks and the M bit levels, to obtain and output the modulated symbol sequence. A quantity (M') of code blocks obtained through encoding is less than a quantity (M) of bit levels, therefore a quantity of to-be-encoded code blocks is reduced. This further reduces coding complexity. The reduced quantity of to-be-encoded code blocks makes code rate allocation simpler, and this further reduces coding complexity.

In a possible implementation, at least two of the M' code blocks have different code lengths.

In the foregoing process, because a code length $N_i$ of each code block is $M_i*N$, when the at least two of the M' code blocks have different code lengths, it can be ensured that the quantity of code blocks is less than the quantity of bit levels.

In a possible implementation, an absolute value of a bit-level capacity difference between the $M_i$ bit levels to which the code block whose code length is $M_i*N$ is mapped is less than or equal to a preset difference.

In the foregoing process, when the absolute value of the bit-level capacity difference between the $M_i$ bit levels to which the code block whose code length is $M_i*N$ is mapped is less than or equal to the preset difference, bit levels that carry a same code block may have a same capacity as much as possible. Therefore, coding performance is high.

In a possible implementation, the K to-be-encoded bits may be encoded based on the M bit levels of the modulation scheme in the following feasible implementation: classifying the K to-be-encoded bits into M' to-be-encoded sequences based on bit-level capacities of the M bit levels, and separately encoding the M' to-be-encoded sequences to obtain the M' codeblocks.

In the foregoing process, the K to-be-encoded bits are first classified into the M' to-be-encoded sequences, and then the M' to-be-encoded sequences are separately encoded. Therefore, coding efficiency is comparatively high, and coding performance is comparatively high.

In a possible implementation, the classifying the K to-be-encoded bits into M' to-be-encoded sequences based on bit-level capacities of the M bit levels includes: classifying the M bit levels into M' groups of bit levels, where each group of bit levels includes at least one bit level; and classifying the K to-be-encoded bits into the M' to-be-encoded sequences based on N, a quantity of bit levels included in each group of bit levels, and a bit-level capacity of each bit level in each group of bit levels.

In the foregoing process, the K to-be-encoded bits are classified based on N, the quantity of bit levels included in each group of bit levels, and the bit-level capacity of each bit level in each group of bit levels. There is a preset correspondence between a bit-level capacity and a code rate. Therefore, a quantity of bits included in each to-be-encoded sequence obtained through division may match a code length and a code rate of a corresponding code block.

In a possible implementation, the modulating the M' code blocks according to a mapping relationship between the M' code blocks and the M bit levels includes: for any $i^{th}$ code block, if $M_i$ is equal to 1, mapping the $i^{th}$ code block to an $i^{th}$ group of bit levels in a constellation diagram; and for any $i^{th}$ code block, if $M_i$ is greater than 1, converting the $i^{th}$ code block into $M_i$ bit streams, and separately mapping the $M_i$ bit streams to the $i^{th}$ group of bit levels in the constellation diagram, where a length of each bit stream is N; and one bit stream is mapped to one bit level of the $i^{th}$ group of bit levels.

In a possible implementation, a difference between bit-level capacities of bit levels in the $i^{th}$ group of bit levels is less than or equal to a preset difference.

In the foregoing process, N bits may be mapped to one bit level, and bits corresponding to one code block are mapped to a bit level in a group of bit levels. When a difference between bit-level capacities of bit levels in a group of bit levels is less than or equal to the preset difference, it can be ensured that bit levels that carry a same code block may have a same capacity as much as possible. Therefore, coding performance is comparatively high.

In a possible implementation, before the converting the $i^{th}$ code block into $M_i$ bit streams, interleaving processing is further performed on the $i^{th}$ code block.

In the foregoing process, interleaving processing is performed on the $i^{th}$ code block, so that capacities of bit levels that carry a same code block may have a same average difference as much as possible. Therefore, coding performance is comparatively high.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

According to a second aspect, an embodiment of this application provides a demodulation and decoding method. The method may include: obtaining N modulated symbols corresponding to M' code blocks, and sequentially demodulating and decoding the M' code blocks based on the N modulated symbols, to obtain decoding results of the M' code blocks, where M'<M, M is a quantity of bit levels of a modulation scheme, N is a symbol block length, a code length of an $i^{th}$ code block is $N_i$, $N_i=M_i*N$, $M_i$ is a quantity of bit levels corresponding to the $i^{th}$ code block, i is an integer from 1 to M', $\Sigma_{i=1}^{i=M'}(M_i)=M$, and M, M', N, $N_i$, and $M_i$ are all positive integers.

In the foregoing process, after the N modulated symbols corresponding to the M' code blocks are obtained, the M' code blocks are sequentially demodulated and decoded based on the N modulated symbols, to obtain the decoding results of the M' code blocks. One code block corresponds to $M_i$ bit levels, where M' is greater than or equal to 1. When M' is greater than 1, parallel demodulation may be performed on the $M_i$ bit levels, to obtain an LLR of the $i^{th}$ code block. This improves demodulation and decoding efficiency. A quantity of to-be-demodulated and to-be-decoded code blocks is reduced, therefore a quantity of CRC checks is reduced. This further improves the demodulation and decoding efficiency.

In a possible implementation, the sequentially demodulating and decoding the M' code blocks based on the N modulated symbols, to obtain decoding results of the M' code blocks includes:

performing demodulation processing on the $i^{th}$ code block, where the demodulation processing includes adding 1 to i, and determining the LLR of the $i^{th}$ code block based on decoding results of first (i−1) code blocks and the N modulated symbols; and an initial value of i is 0;

performing decoding processing on the $i^{th}$ code block, where the decoding processing includes determining a decoding result of the $i^{th}$ code block based on the LLR of the $i^{th}$ code block; and repeatedly performing the demodulation processing and the decoding processing until the decoding results of the M' code blocks are obtained.

In the foregoing demodulation and decoding process, demodulation and decoding are performed block by block, in other words, performed on a per-code block basis. A quantity of code blocks is less than a quantity of bit levels, therefore the quantity of to-be-demodulated and to-be-decoded code blocks is reduced. This improves the demodulation and decoding efficiency.

In a possible implementation, the determining the LLR of the $i^{th}$ code block includes: if $M_i$>1, determining $M_i$ bit levels corresponding to the $i^{th}$ code block; and performing parallel demodulation on the $M_i$ bit levels to obtain the LLR of the $i^{th}$ code block.

In the foregoing process, when M' is greater than 1, parallel demodulation may be performed on the $M_i$ bit levels, to obtain the LLR of the $i^{th}$ code block. This improves the demodulation and decoding efficiency.

In a possible implementation, at least two of the M' code blocks have different code lengths.

In the foregoing process, because a code length $N_i$ of each code block is $M_i*N$, when the at least two of the M' code blocks have different code lengths, it can be ensured that the quantity of code blocks is less than the quantity of bit levels.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

According to a third aspect, an embodiment of this application provides a coding and modulation apparatus, including an obtaining module, a coding module, a modulation module, and an output module.

The obtaining module is configured to obtain K to-be-encoded bits and a modulation scheme, where K is an integer greater than or equal to 1.

The coding module is configured to encode the K to-be-encoded bits based on M bit levels of the modulation scheme, to obtain M' code blocks, where M'<M, a code length of an $i^{th}$ code block is $N_i$, and $N_i=M_i*N$; $M_i$ is a quantity of bit levels corresponding to the $i^{th}$ code block, N is a symbol block length, i is an integer from 1 to M', and $\Sigma_{i=1}^{i=M'}(M_i)=M$; a quantity of information bits included in the $i^{th}$ code block is $K_i$, $\Sigma_{i=1}^{i=M'}(K_i)=K$, and M, M', N, $N_i$, $M_i$, and $K_i$ are all positive integers.

The modulation module is configured to modulate the M' code blocks according to a mapping relationship between the M' code blocks and the M bit levels, to obtain a modulated symbol sequence, where a code block whose code length is $M_i*N$ corresponds to $M_i$ bit levels in the mapping relationship.

The output module is configured to output the modulated symbol sequence.

In a possible implementation, at least two of the M' code blocks have different code lengths.

In a possible implementation, an absolute value of a bit-level capacity difference between the $M_i$ bit levels to which the code block whose code length is $M_i*N$ is mapped is less than or equal to a preset difference.

In a possible implementation, the coding module is configured to:

classify the K to-be-encoded bits into M' to-be-encoded sequences based on bit-level capacities of the M bit levels; and separately encode the M' to-be-encoded sequences to obtain the M' codeblocks.

In a possible implementation, the coding module is configured to:

classify the M bit levels into M' groups of bit levels, where each group of bit levels includes at least one bit level; and classify the K to-be-encoded bits into the M' to-be-encoded sequences based on N, a quantity of bit levels included in each group of bit levels, and a bit-level capacity of each bit level in each group of bit levels.

In a possible implementation, the modulation module is configured to:

for any $i^{th}$ code block, if $M_i$ is equal to 1, map the $i^{th}$ code block to an $i^{th}$ group of bit levels in a constellation diagram; and for any $i^{th}$ code block, if $M_i$ is greater than 1, convert the $i^{th}$ code block into $M_i$ bit streams, and separately map the $M_i$ bit streams to the $i^{th}$ group of bit levels in the constellation diagram, where a length of each bit stream is N; and one bit stream is mapped to one bit level of the $i^{th}$ group of bit levels.

In a possible implementation, a difference between bit-level capacities of bit levels in the $i^{th}$ group of bit levels is less than or equal to a preset difference.

In a possible implementation, the apparatus further includes an interleaving module.

The interleaving module is configured to: before the modulation module converts the $i^{th}$ code block into the $M_i$ bit streams, perform interleaving processing on the $i^{th}$ code block.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

According to a fourth aspect, an embodiment of this application provides a demodulation and decoding apparatus including an obtaining module and a demodulation and decoding module.

The obtaining module is configured to obtain N modulated symbols corresponding to M' code blocks, where M'<M, M is a quantity of bit levels of a modulation scheme, N is a symbol block length, a code length of an $i^{th}$ code block is $N_i$, $N_i=M_i*N$, $M_i$ is a quantity of bit levels corresponding to the $i^{th}$ code block, i is an integer from 1 to M', $\Sigma_{i=1}^{i=M'}(M_i)=M$, and M, M', N, $N_i$, and $M_i$ are all positive integers.

The demodulation and decoding module is configured to sequentially demodulate and decode the M' code blocks based on the N modulated symbols, to obtain decoding results of the M' codeblocks.

In a possible implementation, the demodulation and decoding module is configured to:

perform demodulation processing on the $i^{th}$ code block, where the demodulation processing includes adding 1 to i, and determining an LLR of the $i^{th}$ code block based on decoding results of first (i−1) code blocks and the N modulated symbols; and an initial value of i is 0;

perform decoding processing on the $i^{th}$ code block, where the decoding processing includes determining a decoding result of the $i^{th}$ code block based on the LLR of the $i^{th}$ code block; and repeatedly perform the demodulation processing and the decoding processing until the decoding results of the M' code blocks are obtained.

In a possible implementation, the demodulation and decoding module is configured to:

if $M_i>1$, determine $M_i$ bit levels corresponding to the $i^{th}$ code block; and perform parallel demodulation on the $M_i$ bit levels to obtain the LLR of the $i^{th}$ code block.

In a possible implementation, at least two of the M' code blocks have different code lengths.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

According to a fifth aspect, an embodiment of this application provides a coding and modulation apparatus, including a memory, a processor, and a computer program. The computer program is stored in the memory, and the processor runs the computer program to perform the coding and modulation method according to any one of the first aspect.

According to a sixth aspect, an embodiment of this application provides a coding and modulation apparatus, including a memory, a processor, and a computer program. The computer program is stored in the memory, and the processor runs the computer program to perform the coding and modulation method according to any one of the second aspect.

According to a seventh aspect, an embodiment of this application provides a coding and modulation apparatus, including an input interface, a logic circuit, and an output interface.

The input interface is configured to obtain K to-be-encoded bits and a modulation scheme, where K is an integer greater than or equal to 1.

The logic circuit is configured to encode the K to-be-encoded bits based on M bit levels of the modulation scheme, to obtain M' code blocks, modulate the M' code blocks according to a mapping relationship between the M' code blocks and the M bit levels, to obtain a modulated symbol sequence, where M'<M, a code length of an $i^{th}$ code block is $N_i$, and $N_i=M_i*N$; $M_i$ is a quantity of bit levels corresponding to the $i^{th}$ code block, N is a symbol block length, i is an integer from 1 to M', and $\Sigma_{i=1}^{i=M'}(M_i)=M$; a quantity of information bits included in the $i^{th}$ code block is $K_i$, $\Sigma_{i=1}^{i=M'}(K_i)=K$; M, M', N, $N_i$, $M_i$, and $K_i$ are all positive integers; and a code block whose code length is $M_i*N$ corresponds to $M_i$ bit levels in the mapping relationship.

The output interface is configured to output the modulated symbol sequence.

In a possible implementation, the logic circuit is further configured to perform the coding and modulation method according to any one of the feasible implementations of the first aspect.

According to an eighth aspect, an embodiment of this application provides a demodulation and decoding apparatus, including an input interface and a logic circuit.

The input interface is configured to obtain N modulated symbols corresponding to M' code blocks, where M'<M, M is a quantity of bit levels of a modulation scheme, N is a symbol block length, a code length of an $i^{th}$ code block is $N_i$, $N_i=M_i*N$, $M_i$ is a quantity of bit levels corresponding to the $i^{th}$ code block, i is an integer from 1 to M', $\Sigma_{i=1}^{i=M'}(M_i)=M$, and M, M', N, $N_i$, and $M_i$ are all positive integers.

The logic circuit is configured to sequentially demodulate and decode the M' code blocks based on the N modulated symbols, to obtain decoding results of the M' code blocks.

In a possible implementation, the logic circuit is further configured to perform the demodulation and decoding method according to any one of the feasible implementations of the second aspect.

According to a ninth aspect, an embodiment of this application provides a storage medium. The storage medium includes a computer program, and the computer program is used to implement the coding and modulation method according to any one of the first aspect.

According to a tenth aspect, an embodiment of this application provides a storage medium. The storage medium includes a computer program, and the computer program is used to implement the demodulation and decoding method according to any one of the second aspect.

According to the coding and modulation method, the demodulation and decoding method, the apparatus, and the device provided in the embodiments of this application, when the K to-be-encoded bits are encoded and modulated, the K to-be-encoded bits are encoded based on the M bit levels of the modulation scheme, to obtain the M' code blocks. The M' code blocks are modulated according to the mapping relationship between the M' code blocks and the M bit levels, to obtain and output the modulated symbol sequence. In the foregoing process, a quantity (M') of code blocks obtained through encoding is less than a quantity (M) of bit levels, therefore a quantity of to-be-encoded code blocks is reduced. This further reduces coding complexity. The reduced quantity of to-be-encoded code blocks makes code rate allocation simpler, and this further reduces coding complexity. Correspondingly, during demodulation and decoding, demodulation and decoding are performed block by block. A quantity of code blocks is less than a quantity of bit levels, and therefore the quantity of to-be-demodulated and to-be-decoded code blocks is reduced. This improves decoding efficiency.

DESCRIPTION OF EMBODIMENTS

Figure 1:
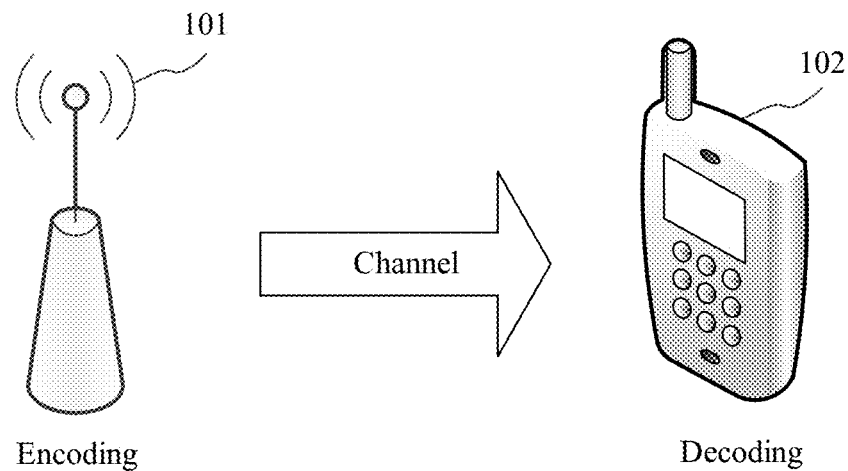
FIG. 1 is a diagram of an architecture of a communications system according to an embodiment of this application.

Embodiments of this application may be used in various fields in which polar coding is used, for example, a data storage field, an optical network communications field, and a wireless communications field. The wireless communications system mentioned in the embodiments of this application includes but is not limited to a narrowband internet of things (NB-IoT) system, a global system for mobile communications (GSM), an enhanced data rate GSM evolution (EDGE) system, it a wideband code division multiple access (WCDMA) system, a code division multiple access 2000 (CDMA2000) system, a time division-synchronous code division multiple access (TD-SCDMA) system, a long term evolution (LTE) system, three application scenarios of a next-generation 5G mobile communications system: enhanced mobile broadband (eMBB), ultra-reliable low-latency communication (URLLC), and massive machine-type communications (mMTC), and possible future communications systems. Certainly, there may be another field in which polar coding is used. This is not limited in this application.

A communications apparatus in this application is mainly a network device or a terminal device. In this application, if a sending device may be a network device, a receiving device is a terminal device. In this application, if a sending device is a terminal device, a receiving device is a network device.

In the embodiments of this application, the terminal device may include but is not limited to a mobile station (MS), a mobile terminal (MT), a mobile telephone (MT), a handset, portable equipment, and the like. The terminal device may communicate with one or more core networks by using a radio access network (RAN). For example, the terminal device may be a mobile telephone (which is also referred to as a "cellular" telephone) or a computer having a wireless communication function. The terminal device may alternatively be a portable, pocket-sized, handheld, computer built-in, or in-vehicle mobile apparatus or device.

In the embodiments of this application, the network device may be an evolved NodeB (eNB or eNodeB) in an LTE system, or may be a gNB, a transmission reception point (TRP), a micro base station, or the like in a 5G communications system, or may be a relay station, an access point, a vehicle-mounted device, a wearable device, a network device in a future evolved public land mobile network (PLMN), a network device in a network in which a plurality of other technologies are converged, a base station in various other evolved networks, or the like.

For example, the network device may be a base station (BS). The base station may provide a communication service for a plurality of mobile stations (MS), and the base station may further be connected to a core network device. The base station includes a baseband unit (BBU) and a remote radio unit (RRU). The BBU and the RRU may be placed at different places. For example, the RRU is remote and placed in a heavy-traffic area, and the BBU is placed in a central equipment room. The BBU and the RRU may alternatively be placed in a same equipment room. The BBU and the RRU may alternatively be different components on one rack.

FIG. 1 is a diagram of an architecture of a communications system according to an embodiment of this application. Refer to FIG. 1. The communications system includes a sending device 101 and a receiving device 102.

Optionally, when the sending device 101 is a terminal device, the receiving device 102 is a network device; or when the sending device 101 is a network device, the receiving device is a terminal device.

Refer to FIG. 1. The sending device 101 includes an encoder. The sending device 101 may perform encoding by using the encoder, and transmit an encoded sequence to the receiving device 102 through a channel. The receiving device 102 includes a decoder. The receiving device may decode the received sequence by using the decoder.

It should be noted that FIG. 1 is merely an example of a diagram of an architecture of a communications system, and is not a limitation on the diagram of the architecture of the communications system.

Figure 2:
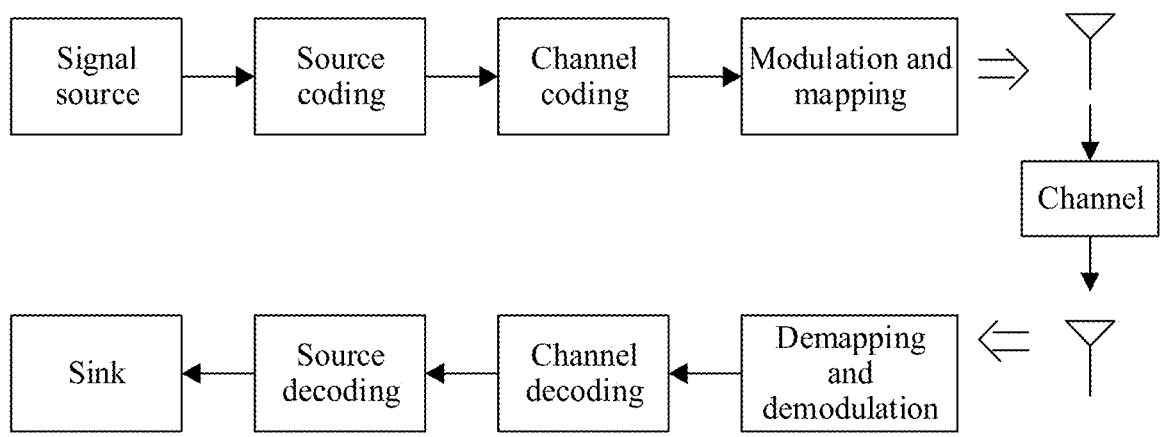
FIG. 2 is a flowchart of channel transmission according to an embodiment of this application.

FIG. 2 is a flowchart of channel transmission according to an embodiment of this application. Refer to FIG. 2. The sending device performs source coding and channel coding on to-be-sent data, performs mapping and modulation on an encoded sequence, and then transmits the encoded sequence to the receiving device through a channel. The receiving device may perform demapping and demodulation processing, channel decoding processing, and source decoding processing on the received sequence, to restore the data sent by the sending device.

Figure 3:
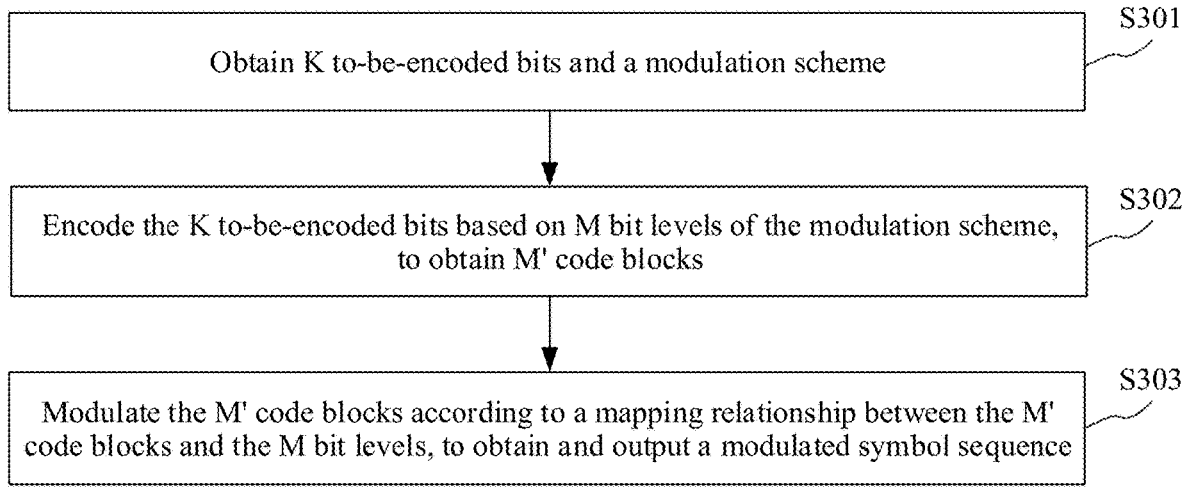
FIG. 3 is a schematic flowchart of a coding and modulation method according to an embodiment of this application.

FIG. 3 is a schematic flowchart of a coding and modulation method according to an embodiment of this application. Refer to FIG. 3. The method may include the following steps.

S301: Obtain K to-be-encoded bits and a modulation scheme.

K is an integer greater than or equal to 1.

Optionally, the K to-be-encoded bits are K to-be-encoded information bits.

The information bits are bits used to carry information, and the information bits may include a cyclic redundancy check (CRC) bit and/or a parity check (PC) bit.

Optionally, the modulation scheme may include 8-phase shift keying (PSK) modulation, 16PSK modulation, and 8-differential phase shift keying (DPSK) modulation, 8 quadrature amplitude modulation (QAM), 16QAM, and the like.

S302: Encode the K to-be-encoded bits based on M bit levels of the modulation scheme, to obtain M' code blocks.

M'<M, in other words, a quantity of code blocks obtained through encoding is less than a quantity of bit levels of the modulation scheme. One code block corresponds to at least one bit level, an $i^{th}$ code block corresponds to $M_i$ bit levels, $\Sigma_{i=1}^{i=M'}(M_i)=M$, $M_i$ is a positive integer, and i is an integer ranging from 1 to M'. If a length (a quantity of included symbols) of a symbol block is N, and a code length of the $i^{th}$ code block is $N_i$, $N_i=M_i*N$. If a quantity of information bits included in the $I^{th}$ code block is $K_i$, $\Sigma_{i=1}^{i=M'}(K_i)=K$, and M, M', N, $N_i$, $M_i$, and $K_i$ are all positive integers.

Optionally, if the modulation scheme is M-order modulation, the modulation scheme has M bit levels.

Optionally, at least two of the M' code blocks have different code lengths. A sum of code lengths of the M' code blocks is M×N. For example, when the modulation scheme is 8PSK modulation or 8DPSK modulation, M=3, M'=2, a code length of one code block is N, and a code length of another code block is 2N. For example, when the modulation scheme is 16QAM, M=4, M'=3, a code length of two code blocks is N, and a code length of another code block is 2N.

Because a code length $N_i$ of each code block is $M_i*N$, when the at least two of the M' code blocks have different code lengths, it can be ensured that the quantity of code blocks is less than the quantity of bit levels.

Optionally, the K to-be-encoded bits may be classified into M' to-be-encoded sequences based on bit-level capacities of the M bit levels. An $i^{th}$ to-be-encoded sequence includes $K_i$ information bits. The M' to-be-encoded sequences are separately encoded to obtain the M' code blocks. A bit-level capacity of each bit level may be obtained, and a code rate corresponding to the bit-level capacity of each bit level may be obtained. The K to-be-encoded bits are classified into the M' to-be-encoded sequences based on the code rate corresponding to the bit-level capacity of each bit level.

With reference to step A to step C, the following describes a feasible implementation of obtaining the M' codeblocks.

Step A: Classify the M bit levels into M' group of bit levels.

An ingroup of bit levels includes $M_i$ bit levels.

Optionally, the Mbit levels may be classified into the M' group of bit levels in at least the following two feasible implementations:

In one feasible implementation:

The M bit levels are classified into M' groups of bit levels based on the bit-level capacities of the M bit levels. An absolute value of a difference between bit-level capacities of bit levels in one group of bit levels is less than or equal to a preset difference.

Optionally, when an absolute value of a difference between bit-level capacities of at least two bit levels in the M bit levels is less than or equal to the preset difference, the M bit levels may be classified into the M' group of bit levels in this feasible implementation.

For example, it is assumed that M=3, three bit levels are respectively denoted as $b_0$, and $b_2$. $b_1$ and $b_2$ have a same bit-level capacity. It is assumed that M'=2, $b_0$ may be classified into one group of bit levels, and $b_1$ and $b_2$ may be classified into one group of bit levels.

For example, it is assumed that M=4, four bit levels are respectively denoted as $b_0$, $b_1$, $b_2$, and $b_3$. $b_2$ and $b_3$ have a same bit-level capacity. It is assumed that M'=3, $b_0$ may be classified into one group of bit levels, $b_1$ may be classified into one group of bit levels, and $b_2$ and $b_3$ may be classified into one group of bit levels.

In another feasible implementation:

The M bit levels are classified into the M' group of bit levels according to an adjacency relationship between the M bit levels.

For example, it is assumed that M=3, three bit levels are respectively denoted as $b_0$, $b_1$, and $b_2$, and M'=2. $b_0$ may be classified into one group of bit levels, and $b_1$ and $b_2$ may be classified into one group of bit levels. Alternatively, $b_0$ and $b_1$ may be classified into one group of bit levels, and $b_2$ may be classified into one group of bit levels.

For example, it is assumed that M=4, four bit levels are respectively denoted as $b_0$, $b_1$, $b_2$, and $b_3$, and M'=3. $b_0$ may be classified into one group of bit levels, $b_1$ may be classified into one group of bit levels, and $b_2$ and $b_3$ may be classified into one group of bit levels. Alternatively, $b_0$ and $b_1$ may be classified into one group of bit levels, $b_2$ may be classified into one group of bit levels, and $b_3$ may be classified into one group of bit levels.

Step B: Classify the K to-be-encoded bits into the M' to-be-encoded sequences based on N, a quantity of bit levels included in each group of bit levels, and a bit-level capacity of each bit level in each group of bit levels.

Optionally, a quantity $K_i$ of information bits included in each to-be-encoded sequence may be first determined, and then the K to-be-encoded bits are classified into the M' to-be-encoded sequences based on the quantity $K_i$ of information bits included in each to-be-encoded sequence.

For any $i^{th}$ to-be-encoded sequence, a code rate $R_i$ corresponding to a bit-level capacity of an $i^{th}$ group of bit levels may be obtained. A quantity $K_{is}$ of information bits included in the $i^{th}$ to-be-encoded sequence is estimated based on N and a quantity $M_i$ of bit levels included in the $i^{th}$ group of bit levels, where $K_{is}=R_i \times N_i$, and $N_i=M_i*N$.

After the quantity $K_{is}$ of information bits included in the $i^{th}$ to-be-encoded sequence is estimated, $K_{is}$ is fine-tuned to obtain the quantity $K_i$ of information bits included in the $i^{th}$ to-be-encoded sequence.

Optionally, $K_{is}$ may be fine-tuned in the following feasible implementation, and $K_{is}$ may be rounded (rounded up, rounded down, rounded off, or the like) to obtain $K_{is}'$. If $\Sigma_{i=1}^{i=M'}(K_{is}')>K$, $K_{is}'$ is decreased (for example, subtract 1, or subtract 2) based on $K_{is}'$ until $\Sigma_{i=1}^{i=M'}(K_{is}')=K$. If $\Sigma_{i=1}^{i=M'}(K_{is}')<K$, $K_{is}'$ is increased (for example, add 1, or add 2) based on $K_{is}'$ until $(K_{is}')=K$.

For example, it is assumed that a quantity of to-be-encoded information bits is 768, and a quantity of to-be-encoded sequences is 2, which are a to-be-encoded sequence 1 and a to-be-encoded sequence 2. It is assumed that $K_{1s}$ of the to-be-encoded sequence 1 that is determined according to the foregoing formula is 27.7, which is rounded down to obtain $K_{1s}'$=being 27. $K_{2s}$ of the to-be-encoded sequence 2 that is determined according to the foregoing formula is 737.28, which is rounded down to obtain $K_{2s}'$=being 737. Because 27+737=764<768, $K_{1s}'$ and $K_{2s}'$ need to be increased. For example, $K_{1s}'$ is increased by 1 to obtain 28, and $K_{2s}'$ is increased by 3 to obtain 740. In other words, the obtained to-be-encoded sequence 1 includes 28 information bits, and the to-be-encoded sequence 2 includes 740 information bits. Therefore, the first 28 information bits in the to-be-encoded information bits may be determined as the to-be-encoded sequence 1, and the $29^{th}$ to the $768^{th}$ information bits in the to-be-encoded information bits may be determined as the to-be-encoded sequence 2.

Certainly, the quantity $K_i$ of information bits included in the to-be-encoded sequence may be determined in another manner. This is not limited in this embodiment of this application.

Step C: Separately encode the M' to-be-encoded sequences to obtain the M' code blocks.

For any $i^{th}$ to-be-encoded sequence, a location of each information bit in the $i^{th}$ to-be-encoded sequence may be determined. Encoding is performed based on the location of each information bit in the $i^{th}$ to-be-encoded sequence, to obtain the $i^{th}$ code block. A quantity of bits included in the $i^{th}$ code block is $N_i$, and the $N_i$ bits include $K_i$ information bits and $N_i - K_i$ frozen bits.

S303: Modulate the M' code blocks according to a mapping relationship between the M' code blocks and the M bit levels, to obtain and output a modulated symbol sequence.

It should be noted that the output operation herein may refer to data transfer between different modules in a same communications device, or may refer to a sending operation of the communications device. This is not limited in this application.

The modulated symbol sequence includes N modulated symbols.

In the mapping relationship, a code block whose code length is $M_i*N$ corresponds to the $M_i$ bit levels.

Optionally, the M' code blocks may be modulated in at least the following two feasible implementations.

In a feasible implementation, a difference between bit-level capacities of bit levels in the $i^{th}$ group of bit levels is less than or equal to a preset difference. A quantity of bit levels included in the $i^{th}$ group of bit levels is $M_i$.

For any $i^{th}$ code block, if $M_i$ is equal to 1, the $i^{th}$ code block is mapped to the $i^{th}$ group of bit levels in a constellation diagram.

For any $i^{th}$ code block, if $M_i$ is greater than 1, the $i^{th}$ code block is converted into $M_i$ bit streams, and the $M_i$ bit streams are separately mapped to the $i^{th}$ group of bit levels in the constellation diagram. A length of each bit stream is N. One bit stream is mapped to one bit level in the $i^{th}$ group of bit levels.

In this feasible implementation, because the difference between the bit-level capacities of the bit levels in the $i^{th}$ group of bit levels is less than or equal to the preset difference, bit levels that carry a same code block may have a same capacity as much as possible.

The following describes the modulation scheme by using the following example.

For example, it is assumed that two code blocks, namely, C1 and C2, are obtained through encoding in S302. It is assumed that the modulation scheme corresponds to three bit levels, which are respectively denoted as $b_0$, $b_1$, and $b_2$. $b_1$ and $b_2$ have a same bit-level capacity. A first group of bit levels includes $b_0$, and a second group of bit levels includes $b_1$ and $b_2$. The code block C1 corresponds to the first group of bit levels, and the code block C2 corresponds to the second group of bit levels.

For the code block C1, the code block C1 may be mapped to $b_0$. For the code block C2, the code block C2 may be converted into two bit streams, which are respectively denoted as B1 and B2. B1 is mapped to $b_1$, and B2 is mapped to $b_2$.

It is assumed that bits included in the code block C1 are $\{b_0^1, b_0^2, \ldots, b_0^N\}$.

It is assumed that bits included in the bit stream B1 are $\{b_1^1, b_1^2, \ldots, b_1^N\}$.

It is assumed that bits included in the bit stream B2 are $\{b_2^1, b_2^2, \ldots, b_2^N\}$.

During mapping, $\{b_2^1, b_1^1, b_0^1\}$ may be mapped to a symbol $x_1$ in the constellation diagram, $\{b_2^N, b_1^N, b_0^N\}$ may be mapped to a symbol $x_2$ in the constellation diagram, and so on. $\{b_2^N, b_1^N, b_0^N\}$ may be mapped to $x_N$ in the constellation diagram. In other words, the N modulated symbols may be obtained after the foregoing modulation.

In another feasible implementation, a difference between bit-level capacities of bit levels in the $i^{th}$ group of bit levels may be greater than a preset difference. A quantity of bit levels included in the $i^{th}$ group of bit levels is $M_i$.

For any $i^{th}$ code block, if $M_i$ is equal to 1, the $i^{th}$ code block is mapped to the $i^{th}$ group of bit levels in a constellation diagram. A quantity of bit levels included in the $i^{th}$ group of bit levels is $M_i$.

For any $i^{th}$ code block, if $M_i$ is greater than 1, interleaving processing is performed on the $i^{th}$ code block, and the $i^{th}$ code block is converted into $M_i$ bit streams. The bit streams are separately mapped to the $i^{th}$ group of bit levels in the constellation diagram. A length of each bit stream is N. One bit stream is mapped to one bit level in the $i^{th}$ group of bit levels.

In this feasible implementation, if $M_i$ is greater than 1, interleaving processing is performed on the $i^{th}$ code block, so that capacities of bit levels that carry a same code block may have a same average difference as much as possible.

The following describes the modulation scheme by using the following example.

For example, it is assumed that two code blocks, namely, C1 and C2, are obtained through encoding in S302. It is assumed that the modulation scheme has three bit levels, which are respectively denoted as $b_0$, $b_1$, and $b_2$. A first group of bit levels includes $b_0$, and a second group of bit levels includes $b_1$ and $b_2$. The code block C1 corresponds to the first group of bit levels, and the code block C2 corresponds to the second group of bit levels.

For the code block C1, the code block C1 may be mapped to $b_0$. For the code block C2, interleaving processing may be first performed on the code block C2, and the code block C2 is converted into two bit streams, which are respectively denoted as B1 and B2. B1 is mapped to $b_1$, and B2 is mapped to $b_2$.

It is assumed that bits included in the code block C1 are $\{b_0^1, b_0^2, \ldots, b_0^N\}$.

It is assumed that bits included in the bit stream B1 are $\{b_1^1, b_1^2, \ldots, b_1^N\}$.

It is assumed that bits included in the bit stream B2 are $\{b_2^1, b_2^2, \ldots, b_2^N\}$.

During mapping, $\{b_2^1, b_1^1, b_0^1\}$ may be mapped to a symbol $x_4$ in the constellation diagram, $\{b_2^2, b_1^2, b_0^2\}$ may be mapped to a symbol $x_2$ in the constellation diagram, and so on. $\{b_2^N, b_1^N, b_0^N\}$ may be mapped to $x_N$ in the constellation diagram. In other words, the N modulated symbols may be obtained after the foregoing modulation.

According to the coding and modulation method provided in this embodiment of this application, when the K to-be-encoded bits are encoded and modulated, the K to-be-encoded bits are encoded based on the M bit levels of the modulation scheme, to obtain the M' code blocks. The M' code blocks are modulated according to the mapping relationship between the M' code blocks and the M bit levels, to obtain and output the modulated symbol sequence. In the foregoing process, a quantity (M') of code blocks obtained through encoding is less than a quantity (M) of bit levels, and therefore a quantity of to-be-encoded code blocks is reduced. This further reduces coding complexity. The reduced quantity of to-be-encoded code blocks makes code rate allocation simpler, and this further reduces coding complexity.

Figure 4:
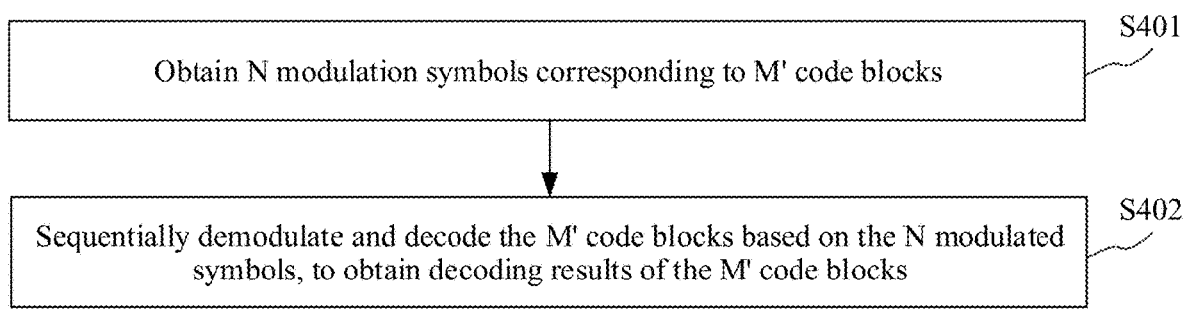
FIG. 4 is a schematic flowchart of a demodulation and decoding method according to an embodiment of this application.

Based on the coding and modulation method shown in FIG. 3, the received modulated symbol may be demodulated and decoded by using the method shown in FIG. 4.

FIG. 4 is a schematic flowchart of a demodulation and decoding method according to an embodiment of this application. Refer to FIG. 4. The method may include the following steps.

S401: Obtain N modulated symbols corresponding to M' code blocks.

M'<M, M is a quantity of bit levels of a modulation scheme, N is a symbol block length, a code length of an $i^{th}$ code block is $N_i$, $N_i = M_i*N$, $M_i$ is a quantity of bit levels corresponding to the $i^{th}$ code block, i is an integer from 1 to M', $\Sigma_{i=1}^{i=M'}(M_i)=M$, and M, M', N, $N_i$, and $M_i$ are all positive integers.

Each modulated symbol includes M bits.

S402: Sequentially demodulate and decode the M' code blocks based on the N modulated symbols, to obtain decoding results of the M' code blocks.

Figure 5:
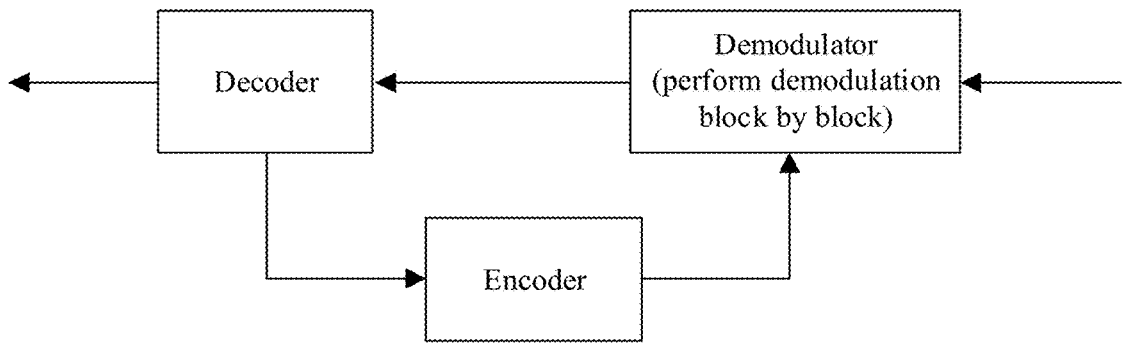
FIG. 5 is a schematic diagram of a demodulation and decoding process according to an embodiment of this application.

Optionally, a demodulation and decoding process may be shown in FIG. 5.

FIG. 5 is a schematic diagram of a demodulation and decoding process according to an embodiment of this application. Refer to FIG. 5. A demodulator demodulates the code blocks block by block. A decoder performs decoding. After obtaining a decoding result of a code block, the decoder re-encodes the decoding result to obtain a code block, and sends the obtained code block to the demodulator to facilitate demodulation of another code block.

Optionally, the decoding results of the M' code blocks may be obtained in the following feasible implementations.

Demodulation processing is performed on an $i^{th}$ code block. The demodulation processing includes adding 1 to i, and determining an LLR of the $i^{th}$ code block based on decoding results of first (i−1) code blocks and the N modulated symbols, where an initial value of i is 0. If $M_i > 1$, $M_i$ bit levels corresponding to the $i^{th}$ code block are determined. Parallel demodulation is performed on the $M_i$ bit levels to obtain the LLR of the $i^{th}$ code block.

Decoding processing is performed on the $i^{th}$ code block. The decoding processing includes determining a decoding result of the $i^{th}$ code block based on the LLR of the $i^{th}$ code block.

The demodulation processing and the decoding processing are repeatedly performed until the decoding results of the M' code blocks are obtained.

The following describes the demodulation and decoding process by using an example.

For example, it is assumed that the modulation scheme has M=3 bit levels, which are respectively denoted as $b_0$, $b_1$, and $b_2$, the received N modulated symbols $\{x_1, x_2, \ldots, x_N\}$ are as follows:

$$x_1 \text{ is } \{b_2^1 b_1^1 \ldots b_0^1\}$$

$$x_2 \text{ is } \{b_2^2 b_1^2 \ldots b_0^2\}$$

$$\ldots$$

$$x_N \text{ is } \{b_2^N b_1^N \ldots b_0^N\}$$

The bit level $b_0$ is $\{b_0^1, b_0^2, \ldots, b_0^N\}$ the bit level $b_1$ is $\{b_1^1, b_1^2, \ldots, b_1^N\}$, and the bit level $b_2$ is $\{b_2^1, b_2^2, \ldots, b_2^N\}$.

It is assumed that a code length of a first code block is N, and a code length of a second code block is 2N. The demodulator demodulates the bit level $b_0$ $\{b_0^1, b_0^2, \ldots, b_0^N\}$ to obtain an LLR of $b_0$ (an LLR of the first code block). The decoder decodes the LLR of the first code block, to obtain a decoding result of the first code block. The demodulator parallelly demodulates the bit level $b_1$ $\{b_1^1, b_1^2, \ldots, b_1^N\}$ and the bit level $b_2$ $\{b_2^1, b_2^2, \ldots, b_2^N\}$ based on the decoding result of the first code block, to obtain LLRs of $b_2$ and $b_1$ (an LLR of the second code block) at the same time. The demodulator performs parallel-to-serial conversion on the LLRs of $b_2$ and $b_1$. The decoder decodes the converted LLRs of $b_2$ and $b_1$, to obtain a decoding result of the second code block.

According to the demodulation and decoding method provided in this embodiment of this application, after the N modulated symbols corresponding to the M' code blocks are obtained, the M' code blocks are sequentially demodulated and decoded based on the N modulated symbols, to obtain the decoding results of the M' code blocks. One code block corresponds to $M_i$ bit levels, where M' is greater than or equal to 1. When M' is greater than 1, parallel demodulation may be performed on the $M_i$ bit levels, to obtain an LLR of the $i^{th}$ code block. This improves demodulation and decoding efficiency. A quantity of to-be-demodulated and to-be-decoded code blocks is reduced, and a quantity of CRC checks is reduced. This further improves the demodulation and decoding efficiency.

Based on any one of the foregoing embodiments, the following describes the foregoing coding and modulation method and the foregoing demodulation and decoding method by using specific examples.

Example 1: The modulation scheme is 8PSK, and 8PSK has three bit levels, which are respectively denoted as $b_0$, $b_1$, and $b_2$. A symbol block length N=512, a total code rate is 0.5, a quantity K of to-be-encoded information bits=768, and a quantity of code blocks M'=2, which are respectively denoted as a code block C1 and a code block C2. A constellation diagram used in modulation mapping (constellation mapping) is shown in FIG. 6.

Figure 6:
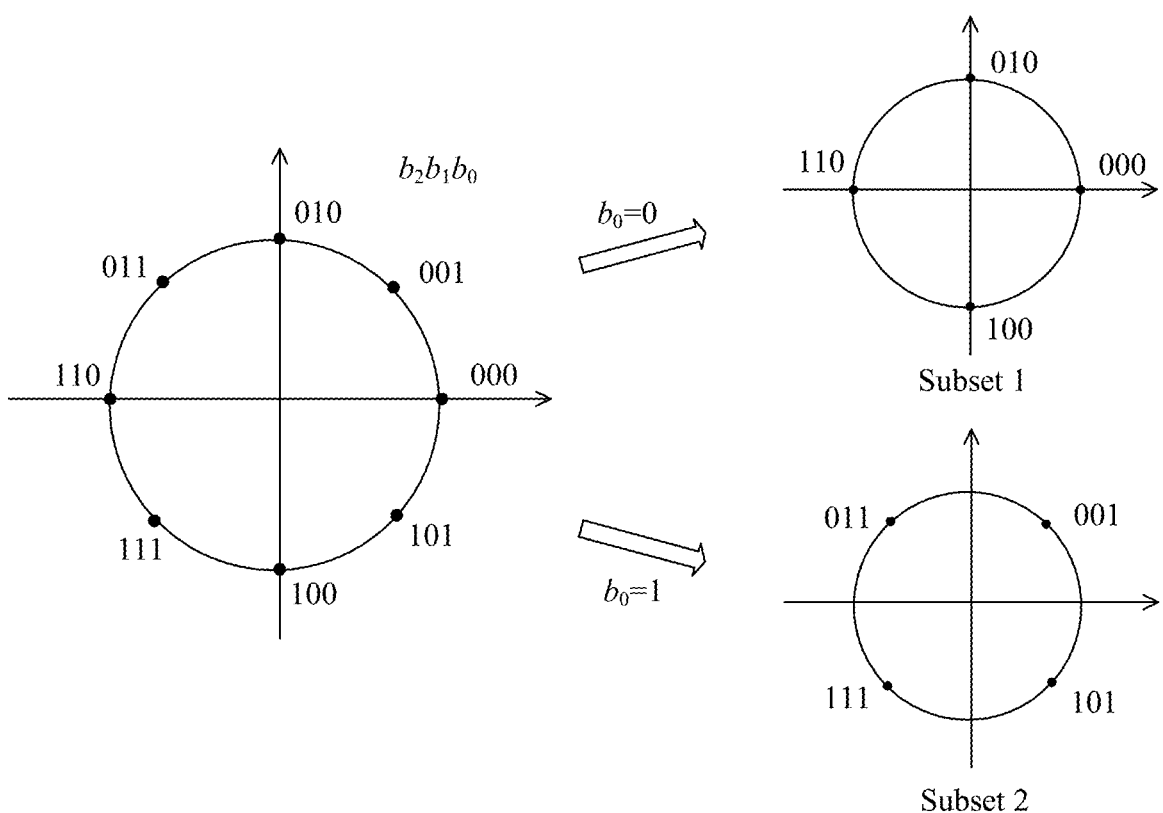
FIG. 6 is a constellation diagram of 8PSK partial set partition mapping according to an embodiment of this application.

FIG. 6 is a constellation diagram of 8PSK partial set partition mapping according to an embodiment of this application. Refer to FIG. 6. Partition may be performed based on the bit level $b_0$ being 0 or 1, to obtain a subset 1 and a subset 2. In the subset 1 and the subset 2, the bit level $b_1$ and the bit level $b_2$ satisfy a Gray mapping feature. Therefore, the bit level $b_1$ and the bit level $b_2$ have a same bit-level capacity. The Gray mapping feature means that only one binary number in two adjacent codes is different.

According to the constellation diagram shown in FIG. 6, because the quantity of code blocks is 2, bit levels may be classified into two groups. A first group of bit levels includes the bit level $b_0$, and a second group of bit levels includes the bit level $b_1$ and the bit level $b_2$.

Figure 7:
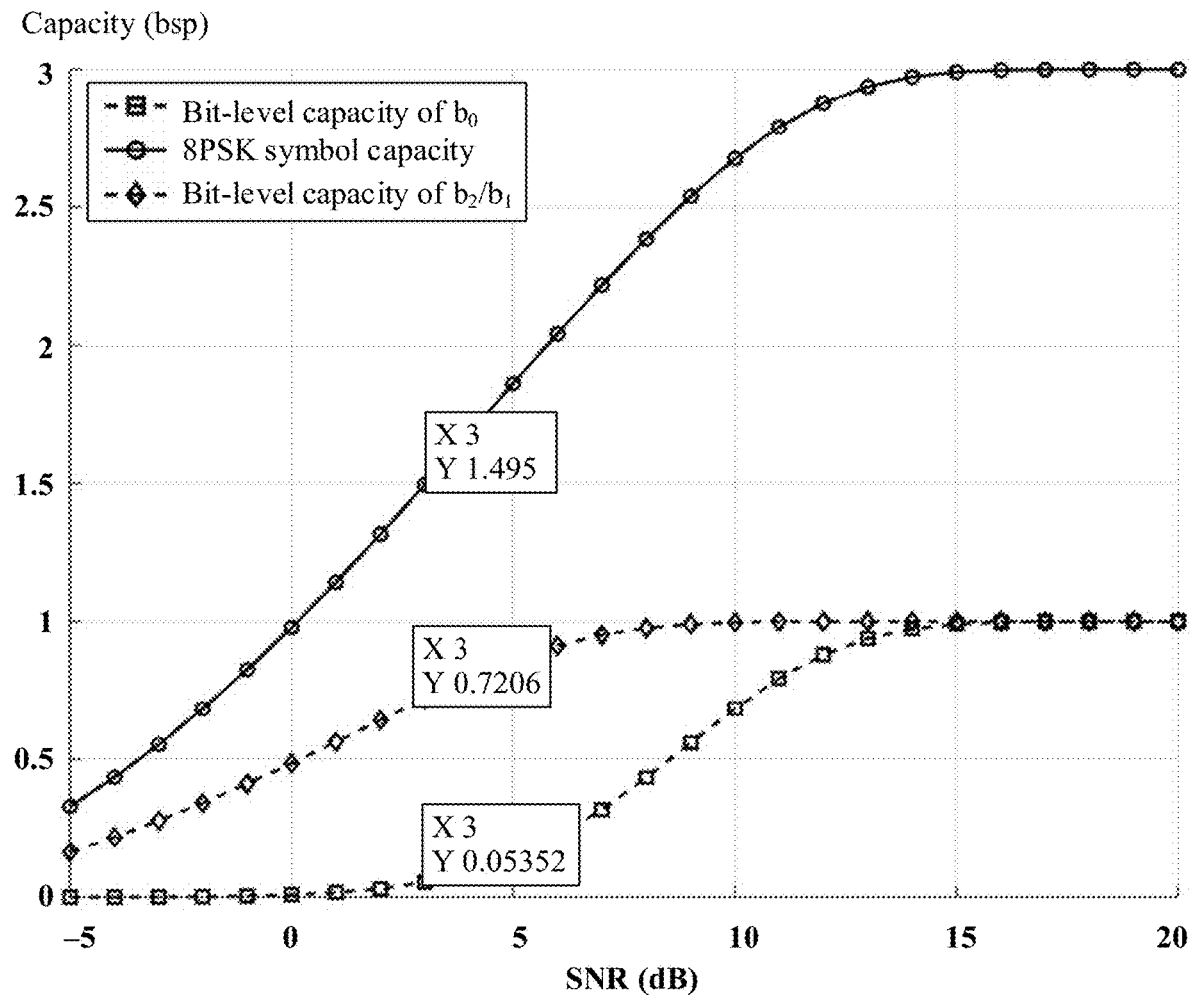
FIG. 7 is a schematic diagram of a symbol capacity and a bit-level capacity of 8PSK partial set partition mapping according to an embodiment of this application.

It is assumed that a symbol capacity and a bit-level capacity of 8PSK partial set partition mapping are shown in FIG. 7. FIG. 7 is a schematic diagram of a symbol capacity and a bit-level capacity of 8PSK partial set partition mapping according to an embodiment of this application. Refer to FIG. 7. A horizontal axis indicates a signal-to-noise ratio (SNR), and a vertical axis indicates a capacity. When the total code rate is set to 0.5, a code rate corresponding to a bit-level capacity of the first group of bit levels may be 0.054, and a code rate corresponding to a bit-level capacity of the second group of bit levels may be 0.72.

It is assumed that, in the configured mapping relationship, if the code block C1 corresponds to the first group of bit levels, and the code block C2 corresponds to the second group of bit levels, a code length of the code block C1 is 512, and a code length of the code block C2 is 1024.

The 768 to-be-encoded information bits are classified into two to-be-encoded sequences, which are respectively denoted as a to-be-encoded sequence 1 and a to-be-encoded sequence 2. A quantity of information bits included in the to-be-encoded sequence 1 is: 512×0.054=27.648. 27.648 is rounded off to obtain 28. It is determined that the to-be-encoded sequence 1 includes 28 information bits. The to-be-encoded sequence 2 includes 768−28=740 information bits.

The to-be-encoded sequence 1 is encoded to obtain the code block C1. The to-be-encoded sequence 2 is encoded to obtain the code block C2.

Figure 8:
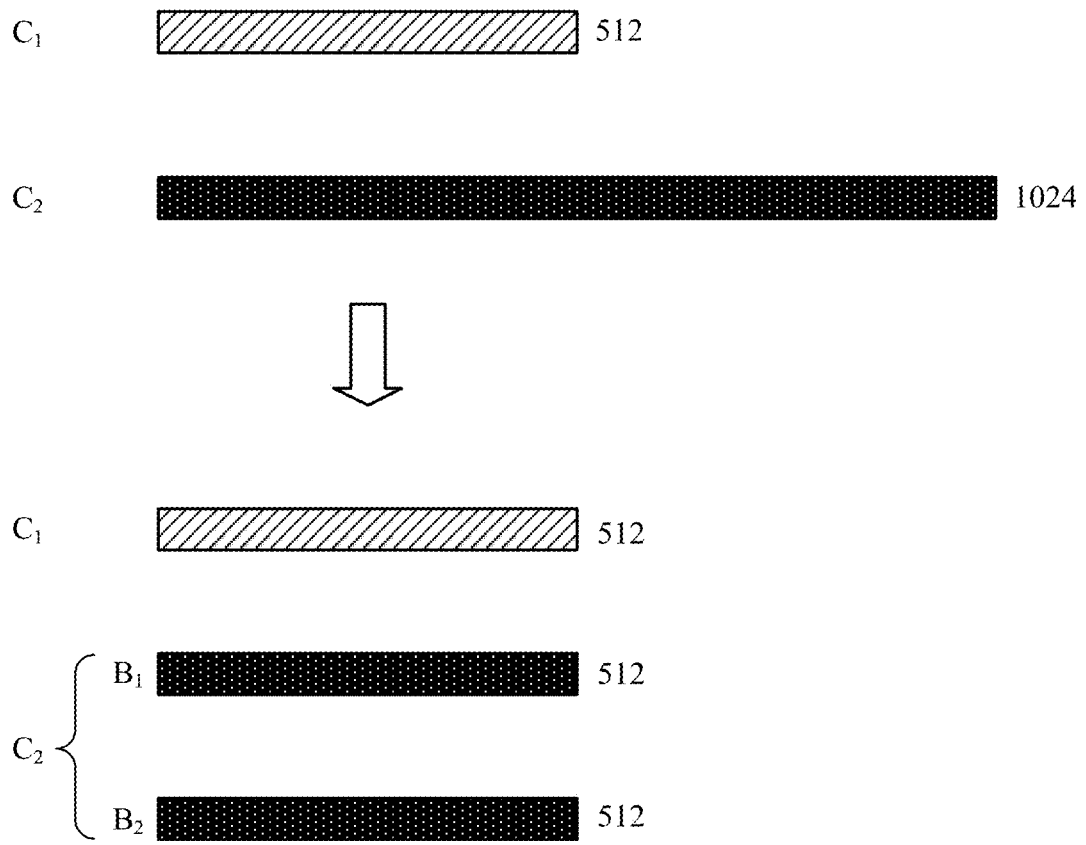
FIG. 8 is a schematic diagram of a code block according to an embodiment of this application.

FIG. 8 is a schematic diagram of a code block according to an embodiment of this application. Refer to FIG. 8. A code length of the code block C1 obtained by encoding the to-be-encoded sequence 1 is 512, and a code length of the code block C2 obtained by encoding the to-be-encoded sequence 2 is 1024. Serial-to-parallel conversion is performed on the code block C2, to obtain a bit stream B1 and a bit stream B2. Code lengths of the bit stream B1 and the bit stream B2 are each 512.

It is assumed that bits included in the code block C1 are $\{b_0^1, b_0^2, \ldots, b_0^{512}\}$.

It is assumed that bits included in the bit stream B1 are $\{b_1^1, b_1^2, \ldots, b_1^{512}\}$.

It is assumed that bits included in the bit stream B2 are $\{b_2^1, b_2^2, \ldots, b_2^{512}\}$.

During mapping, $\{b_2^1, b_1^1, b_0^1\}$ may be mapped to a symbol $x_1$ in a constellation diagram, $\{b_2^2, b_1^2, b_0^2\}$ may be mapped to a symbol $x_2$ in the constellation diagram, and so on. $\{b_2^{512}, b_1^{512}, b_0^{512}\}$ may be mapped to $x_{512}$ in the constellation diagram. In other words, 512 modulated symbols may be obtained after the foregoing modulation. For example, in FIG. 6, it is assumed that $b_2^1 b_1^1 b_0^1 = 000$, and $\{b_2^N, b_1^N, b_0^N\}$ is mapped to a constellation point denoted as "000" in FIG. 6. It is assumed that $b_2^N b_1^N b_0^N = 001$, and $\{b_2^N, b_1^N, b_0^N\}$ is mapped to a constellation point denoted as "001" in FIG. 6.

After 512 modulated symbols $\{x_1, x_2, \ldots, \text{and } x_{512}\}$ are obtained, a modulated symbol sequence $\{x_1, x_2, \ldots, \text{and } x_{512}\}$ is output. Each modulated symbol includes three bits.

A receive end receives the 512 modulated symbols $\{x_1, x_2, \ldots, \text{and } x_{512}\}$, which are:

$x_1$ is $\{b_2^1 b_1^1 \ldots b_0^1\}$ $x_2$ is $\{b_2^2 b_1^2 \ldots b_0^2\}$

...

$x_{512}$ is $\{b_2^{512} b_1^{512} \ldots b_0^{512}\}$

The bit level $b_0$ is $\{b_0^1, b_0^2 \ldots b_0^{512}\}$, the bit level $b_1$ is $\{b_1^1, b_1^2 \ldots b_1^{512}\}$, and the bit level $b_2$ is $\{b_2^1, b_2^2 \ldots b_2^{512}\}$.

The demodulator demodulates the bit level $b_0$ $\{b_0^1, b_0^2 \ldots b_0^{512}\}$ to obtain an LLR of $b_0$ (an LLR of the code block C1). The decoder decodes the LLR of the code block C1, to obtain a decoding result of the code block C1. The demodulator parallelly demodulates the bit level $b_1$ $\{b_1^1, b_1^2 \ldots b_1^{512}\}$ and the bit level $b_2$ $\{b_2^1, b_2^2 \ldots b_2^{512}\}$ based on the decoding result of the code block C1, to obtain LLRs of $b_2$ and $b_1$ (an LLR of the code block C2) at the same time. The demodulator performs parallel-to-serial conversion on the LLRs of $b_2$ and $b_1$. The decoder decodes the converted LLRs of $b_2$ and $b_1$, to obtain a decoding result of the code block C2. Optionally, the decoding result of the code block C1 and the decoding result of the code block C2 may be combined, to obtain a decoding result of the modulated symbol.

Example 2: The modulation scheme is 8DPSK, and 8DPSK has three bit levels, which are respectively denoted as $b_0$, $b_1$, and $b_2$. A symbol block length N=512, a total code rate is 0.5, a quantity K of to-be-encoded information bits=768, and a quantity M' of code blocks=2, which are respectively denoted as a code block C1 and a code block C2. A constellation diagram used in modulation mapping (constellation mapping) is shown in FIG. 9.

Figure 9:
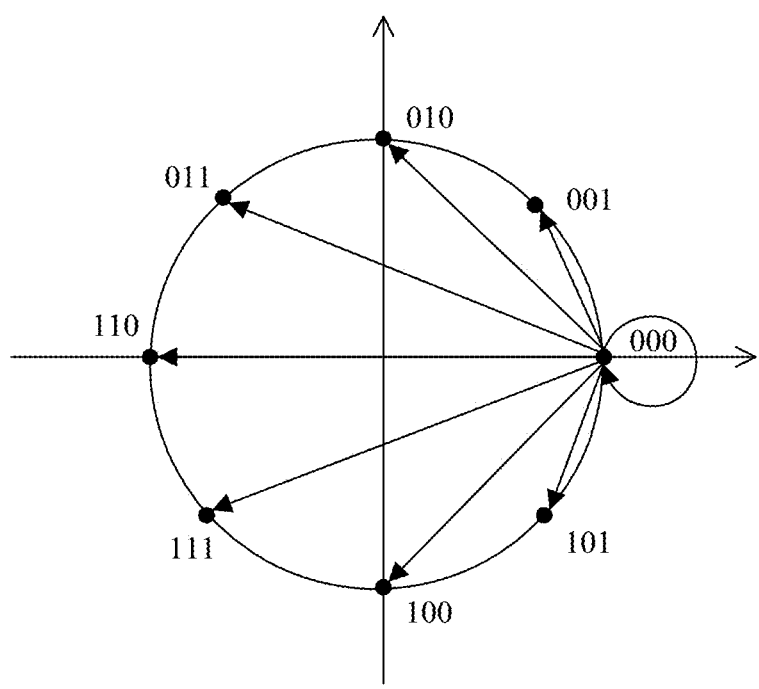
FIG. 9 is a phase transfer diagram of 8DPSK set partition mapping according to an embodiment of this application.

FIG. 9 is a phase transfer diagram of 8DPSK set partition mapping according to an embodiment of this application. In a case of the phase transfer diagram of 8DPSK set partition mapping, a phase difference mapping table is shown in Table 1:

TABLE 1

| Binary data | Phase difference $\Delta\theta_k$ (unit: $\pi$) |
|---|---|
| 000 | 0 |
| 001 | ¼ |
| 010 | ½ |
| 011 | ¾ |
| 100 | −½ |
| 101 | −¼ |
| 110 | 1 |
| 111 | −¾ |

Compared with 8PSK constellation mapping, 8DPSK mapping maps a bit sequence to a phase difference, and correlation between adjacent symbols is introduced. Correlation between the adjacent symbols is:

$$s_k = s_{k-1} \cdot \Delta\theta_k$$

$s_k$ is a $k^{th}$ symbol, and $\Delta\theta_k$ is a phase difference between the $k^{th}$ symbol and a $(k-1)j^{*11}$ symbol.

It should be noted that, in the modulation and coding process, compared with 8PSK constellation mapping, 8DPSK mapping maps a bit sequence to a phase difference. Other processes are the same as those described in Example 1, and details are not described herein again.

Correspondingly, after receiving the modulated symbols, a receive end may perform differential demodulation on the modulated symbols to obtain a phase difference, to eliminate correlation between adjacent symbols. A demodulation manner is as follows:

$$y_n = \frac{r_n \cdot r_{n-1}^*}{|r_{n-1}|^2}$$

$r_n$ is a received $n^{th}$ modulated symbol, and $y_n$ indicates an $n^{th}$ differentially demodulated symbol.

It should be noted that after differentially demodulation, $y_n$ is equivalent to a modulated symbol received by the receive end on a 8PSK constellation page. After obtaining $y_n$, the receive end demodulates and decodes $y_n$ using same methods as those described in Example 1. Details are not described herein again.

Example 3: The modulation scheme is 16QAM, and 16QAM has four bit levels, which are respectively denoted as $b_0$, $b_2$, and $b_3$. A symbol block length N=512, a total code rate is 0.5, and a quantity M' of code blocks=3, which are respectively denoted as a code block C1, a code block C2, and a code block C3. A constellation diagram used in modulation mapping (constellation mapping) is shown in FIG. 10.

Figure 10:
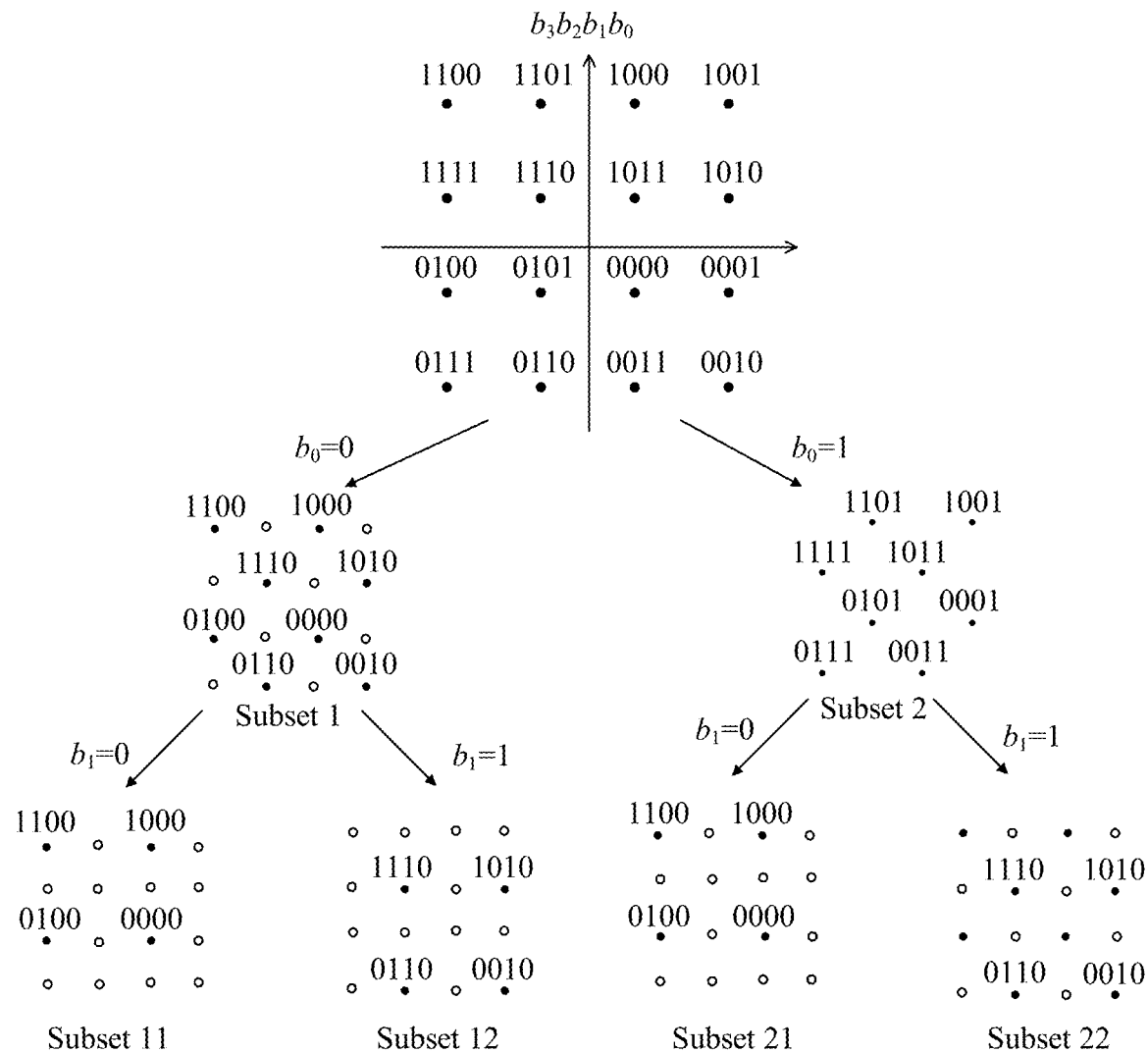
FIG. 10 is a constellation diagram of 16QAM partial set partition mapping according to an embodiment of this application.

FIG. 10 is a constellation diagram of 16QAM partial set partition mapping according to an embodiment of this application. Refer to FIG. 10. Partition may be performed based on the bit level $b_0$ being 0 or 1, to obtain a subset 1 and a subset 2. For the subset 1, the subset 1 may be partitioned based on $b_1$ being 0 or 1, to obtain a subset 11 and a subset 12. For the subset 2, the subset 2 may be partitioned based on $b_1$ being 0 or 1, to obtain a subset 21 and a subset 22. In the subset 11 and the subset 12, the bit level $b_3$ and the bit level $b_2$ satisfy a Gray mapping feature. In the subset 21 and the subset 22, the bit level $b_3$ and the bit level $b_2$ satisfy the Gray mapping feature. Therefore, the bit level $b_3$ and the bit level $b_2$ have a same bit-level capacity.

According to the constellation diagram shown in FIG. 10, because the quantity of code blocks is 3, bit levels may be classified into three groups. A first group of bit levels includes the bit level $b_0$, a second group of bit levels includes the bit level $b_1$, and a third group of bit levels includes the bit level $b_2$ and the bit level $b_3$.

It is assumed that, in the configured mapping relationship, if the code block C1 corresponds to the first group of bit levels, the code block C2 corresponds to the second group of bit levels, and the code block C3 corresponds to the third group of bit levels, a code length of the code block C1 is 512, a code length of the code block C2 is 512, and a code length of the code block C3 is 1024.

Three to-be-encoded sequences are separately determined based on a code rate corresponding to a bit-level capacity of each group of bit levels. The three to-be-encoded sequences are a to-be-encoded sequence 1, a to-be-encoded sequence 2, and a to-be-encoded sequence 3. For a specific process, refer to Example 1, and details are not described herein again.

The to-be-encoded sequence 1 is encoded to obtain the code block C1. The to-be-encoded sequence 2 is encoded to obtain the code block C2. The to-be-encoded sequence 3 is encoded to obtain the code block C3. The code length of the code block C1 is 512, the code length of the code block C2 is 512, and the code length of the code block C3 is 1024. Serial-to-parallel conversion is performed on the code block C3, to obtain a bit stream B1 and a bit stream B2. Code lengths of the bit stream B1 and the bit stream B2 are each 512.

The code block C1 is mapped to the bit level $b_0$, and the code block C2 is mapped to the bit level $b_1$. The bit stream B1 is mapped to the bit level $b_2$, and the bit stream B2 is mapped to the bit level $b_3$, to obtain 512 modulated symbols $\{x_1, x_2, \ldots, \text{and } x_{512}\}$. For a specific mapping process, refer to Example 1, and details are not described herein again.

After the 512 modulated symbols $\{x_1, x_2, \ldots, \text{and } x_{512}\}$ are obtained, a modulated symbol sequence $\{x_1, x_2, \ldots, \text{and } x_{512}\}$ is output. Each modulated symbol includes four bits.

A receive end receives the 512 modulated symbols $\{x_1, x_2, \ldots, \text{and } x_{512}\}$, which are:

$x_1$ is $\{b_3^1 b_2^1 b_1^2 \ldots b_0^1\}$ $x_2$ is $\{b_3^2 b_2^2 b_1^1 \ldots b_0^2\}$ $\ldots$ $x_{512}$ is $\{b_3^{512} b_2^{512} b_1^{512} \ldots b_0^{512}\}$ The bit level $b_0$ is $\{b_0^1, b_0^2 \ldots b_0^{12}\}$, the bit level $b_1$ is $\{b_1^1, b_1^2 \ldots b_1^{512}\}$, the bit level $b_2$ is $\{b_2^1, b_2^2 \ldots b_2^{512}\}$, and the bit level $b_3$ is $\{b_3^1, b_3^2 \ldots b_3^{512}\}$.

The demodulator demodulates the bit level $b_0$ $\{b_0^1, b_0^2 \ldots b_0^{512}\}$ to obtain an LLR of $b_0$ (an LLR of the code block C1). The decoder decodes the LLR of the code block C1, to obtain a decoding result of the code block C1. The demodulator demodulates the bit level $b_1$ $\{b_1^1, b_1^2 \ldots b_1^{512}\}$ (based on the decoding result of the code block C1, to obtain an LLR of $b_1$ (an LLR of the code block C2). The decoder decodes the LLR of the code block C2, to obtain a decoding result of the code block C2. The demodulator parallelly demodulates the bit level $b_2$ $\{b_1^2, b_2^2 \ldots b_2^{512}\}$ (and the bit level $b_3$ $\{b_3^1, b_3^2 \ldots b_3^{512}\}$ (based on the decoding results of the code block C1 and the code block C2, to obtain LLRs of $b_3$ and $b_2$ (an LLR of the code block C3) at the same time. The demodulator performs parallel-to-serial conversion on the LLRs of $b_3$ and $b_2$. The decoder decodes the converted LLRs of $b_3$ and $b_2$, to obtain a decoding result of the code block C3. Optionally, the decoding result of the code block C1, the decoding result of the code block C2, and the decoding result of the code block C3 may be combined, to obtain a decoding result of the modulated symbol.

Example 4: The modulation scheme is 8PSK, and 8PSK has three bit levels, which are respectively denoted as $b_0$, $b_1$, and $b_2$. A symbol block length N=512, a total code rate is 0.5, a quantity of M' code blocks=2, which are respectively denoted as a code block C1 and a code block C2. A constellation diagram used in modulation mapping (constellation mapping) is shown in FIG. 11.

Figure 11:
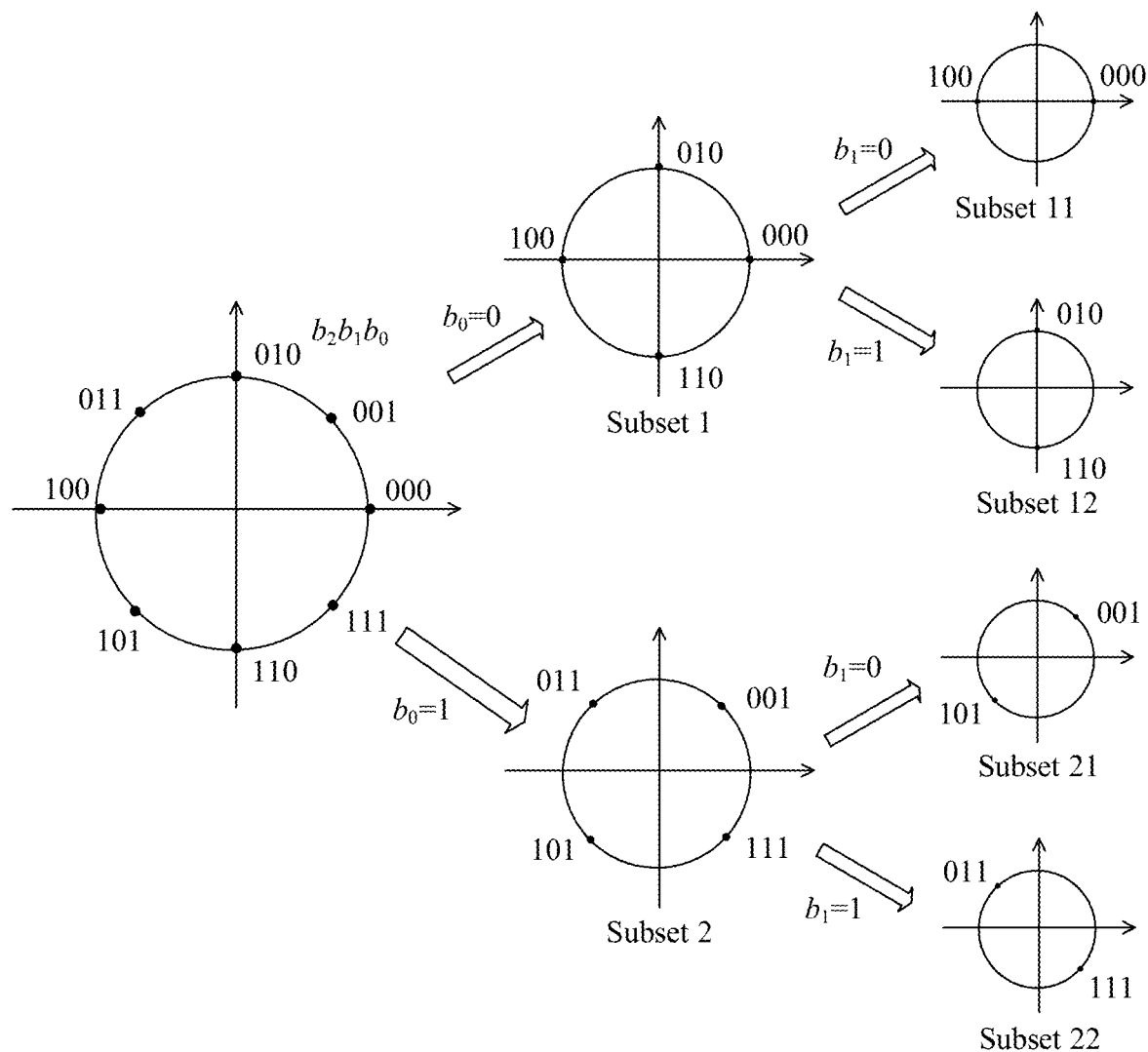
FIG. 11 is a constellation diagram of 8PSK set partition mapping according to an embodiment of this application.

FIG. 11 is a constellation diagram of 8PSK set partition mapping according to an embodiment of this application. Refer to FIG. 11. Partition may be performed based on the bit level $b_0$ being 0 or 1, to obtain a subset 1 and a subset 2. For the subset 1, the subset 1 may be partitioned based on $b_1$ being 0 or 1, to obtain a subset 11 and a subset 12. For the subset 2, the subset 2 may be partitioned based on $b_1$ being 0 or 1, to obtain a subset 21 and a subset 22.

According to the constellation diagram shown in FIG. 11, because the quantity of code blocks is 3, bit levels may be classified into three groups. A first group of bit levels includes the bit level $b_0$, and a second group of bit levels includes the bit level $b_1$ and the bit level $b_2$.

It is assumed that, in the configured mapping relationship, if the code block C1 corresponds to the first group of bit levels, and the code block C2 corresponds to the second group of bit levels, a code length of the code block C1 is 512, and a code length of the code block C2 is 1024.

Two to-be-encoded sequences are separately determined based on a code rate corresponding to a bit-level capacity of each group of bit-levels. The two to-be-encoded sequences are a to-be-encoded sequence 1 and a to-be-encoded sequence 2 For a specific process, refer to Example 1, and details are not described herein again.

The to-be-encoded sequence 1 is encoded to obtain the code block C1. The to-be-encoded sequence 2 is encoded to obtain the code block C2. The code length of the code block C1 is 512, and the code length of the code block C2 is 1024. Interleaving processing is performed on the code block C2, and serial-to-parallel conversion is performed on the interleaved code block C2, to obtain a bit stream B1 and a bit stream B2. Code lengths of the bit stream B1 and the bit stream B2 are each 512.

The code block C1 is mapped to the bit level $b_0$, the bit stream B1 is mapped to the bit level $b_1$, and the bit stream B2 is mapped to the bit level $b_2$, to obtain 512 modulated symbols $\{x_1, x_2, \ldots, x_{512}\}$. For a specific mapping process, refer to Example 1, and details are not described herein again.

After the 512 modulated symbols $\{x_4, x_2, \ldots, \text{and } x_{512}\}$ are obtained, a modulated symbol sequence $\{x_1, x_2, \ldots, \text{and } x_{512}\}$ is output. Each modulated symbol includes three bits.

A receive end receives the 512 modulated symbols, and demodulates and decodes the 512 modulated symbols. For a demodulation and decoding process, refer to Example 1, and details are not described herein again.

Figure 12:
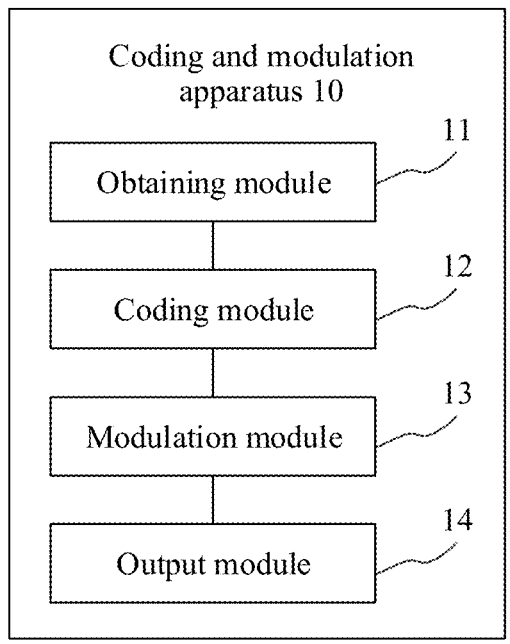
FIG. 12 is a schematic diagram of a structure of a coding and modulation apparatus according to an embodiment of this application.

FIG. 12 is a schematic diagram of a structure of a coding and modulation apparatus 10 according to an embodiment of this application. Refer to FIG. 12. The coding and modulation apparatus 10 may include an obtaining module 11, a coding module 12, a modulation module 13, and an output module 14.

The obtaining module 11 is configured to obtain K to-be-encoded bits and a modulation scheme, where K is an integer greater than or equal to 1.

The coding module 12 is configured to encode the K to-be-encoded bits based on M bit levels of the modulation scheme, to obtain M' code blocks, where M'<M, a code length of an $i^{th}$ code block is $N_i$, and $N_i=M_i*N$; $M_i$ is a quantity of bit levels corresponding to the $i^{th}$ code block, N is a symbol block length, i is an integer from 1 to M', and $\Sigma_{i=1}^{i=M'}(M_i)=M$; a quantity of information bits included in the $i^{th}$ code block is $K_i$, and $\Sigma_{i=1}^{i=M'}(K_i)=K$; and M, M', N, $N_i$, $M_i$, and $K_i$ are all positive integers.

The modulation module 13 is configured to modulate the M' code blocks according to a mapping relationship between the M' code blocks and the M bit levels, to obtain a modulated symbol sequence, where a code block whose code length is $M_i*N$ corresponds to $M_i$ bit levels in the mapping relationship.

The output module 14 is configured to output the modulated symbol sequence.

Optionally, the obtaining module 11 may perform S301 in the embodiment shown in FIG. 3.

Optionally, the coding module 12 may perform S302 in the embodiment shown in FIG. 3.

Optionally, the modulation module 13 and the output module 14 may perform S303 in the embodiment shown in FIG. 3.

The coding and modulation apparatus 10 provided in this embodiment of this application can perform the technical solutions shown in the foregoing method embodiments. Their implementation principles and advantageous effects are similar, and details are not described herein again.

In a possible implementation, at least two of the M' code blocks have different code lengths.

In a possible implementation, an absolute value of a bit-level capacity difference between the $M_i$ bit levels to which the code block whose code length is $M_i*N$ is mapped is less than or equal to a preset difference.

In a possible implementation, the coding module 12 is configured to:

classify the K to-be-encoded bits into M' to-be-encoded sequences based on bit-level capacities of the M bit levels; and separately encode the M' to-be-encoded sequences to obtain the M' codeblocks.

In a possible implementation, the coding module 12 is configured to:

classify the M bit levels into M' groups of bit levels, where each group of bit levels includes at least one bit level; and classify the K to-be-encoded bits into the M' to-be-encoded sequences based on N, a quantity of bit levels included in each group of bit levels, and a bit-level capacity of each bit level in each group of bit levels.

In a possible implementation, the modulation module 13 is configured to:

for any $i^{th}$ code block, if $M_i$ is equal to 1, map the $i^{th}$ code block to an $i^{th}$ group of bit levels in a constellation diagram; and for any $i^{th}$ code block, if $M_i$ is greater than 1, convert the $i^{th}$ code block into $M_i$ bit streams, and separately map the $M_i$ bit streams to the $i^{th}$ group of bit levels in the constellation diagram, where a length of each bit stream is N; and one bit stream is mapped to one bit level of the $i^{th}$ group of bit levels.

In a possible implementation, a difference between bit-level capacities of bit levels in the $i^{th}$ group of bit levels is less than or equal to a preset difference.

Figure 13:
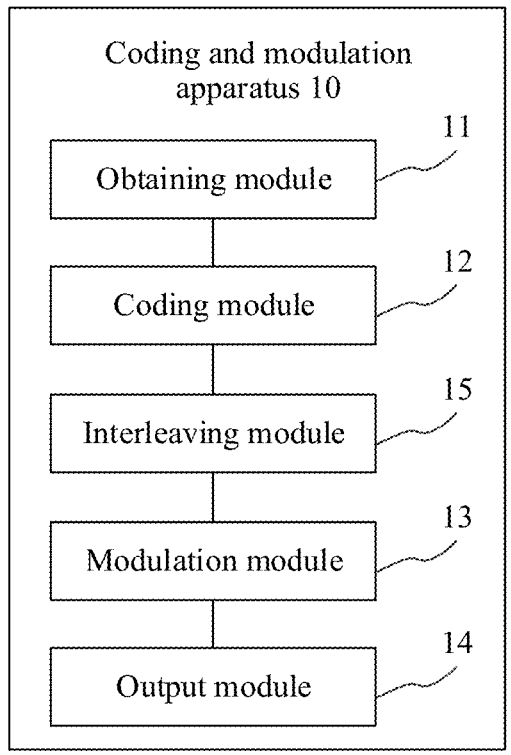
FIG. 13 is a schematic diagram of a structure of another coding and modulation apparatus according to an embodiment of this application.

FIG. 13 is a schematic diagram of a structure of another coding and modulation apparatus according to an embodiment of this application. Based on the embodiment shown in FIG. 12, in FIG. 13, the coding and modulation apparatus 10 further includes an interleaving module 15.

The interleaving module 15 is configured to: before the modulation module 13 converts the $i^{th}$ code block into the $M_i$ bit streams, perform interleaving processing on the $i^{th}$ code block.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

The coding and modulation apparatus 10 provided in this embodiment of this application can perform the technical solutions shown in the foregoing method embodiments. Their implementation principles and advantageous effects are similar, and details are not described herein again.

Figure 14:
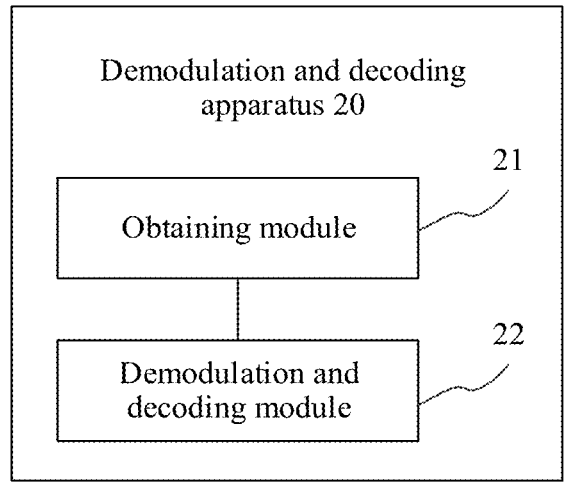
FIG. 14 is a schematic diagram of a structure of a demodulation and decoding apparatus according to an embodiment of this application.

FIG. 14 is a schematic diagram of a structure of a demodulation and decoding apparatus 20 according to an embodiment of this application. Refer to FIG. 14. The demodulation and decoding apparatus 20 may include an obtaining module 21 and a demodulation and decoding module 22.

The obtaining module 21 is configured to obtain N modulated symbols corresponding to M' code blocks, where M'<M, M is a quantity of bit levels of a modulation scheme, N is a symbol block length, a code length of an $i^{th}$ code block is $N_i$, $N_i=M_i*N$, $M_i$ is a quantity of bit levels corresponding to the $i^{th}$ code block, i is an integer from 1 to M', and $\Sigma_{i=1}^{i=M'}(M_i)=M$; M, M', N, $N_i$, and $M_i$ are all positive integers.

The demodulation and decoding module 22 is configured to sequentially demodulate and decode the M' code blocks based on the N modulated symbols, to obtain decoding results of the M' codeblocks.

Optionally, the obtaining module 21 may perform S401 in the embodiment shown in FIG. 4.

Optionally, the demodulation and decoding module 22 may perform S402 in the embodiment shown in FIG. 4.

The demodulation and decoding apparatus 20 provided in this embodiment of this application can perform the technical solutions shown in the foregoing method embodiments. Their implementation principles and advantageous effects are similar, and details are not described herein again.

In a possible implementation, the demodulation and decoding module 22 is configured to:

perform demodulation processing on the $i^{th}$ code block, where the demodulation processing includes adding 1 to i, and determining an LLR of the $i^{th}$ code block based on decoding results of first (i−1) code blocks and the N modulated symbols; an initial value of i is 0; and perform decoding processing on the $i^{th}$ code block, where the decoding processing includes determining a decoding result of the $i^{th}$ code block based on the LLR of the $i^{th}$ code block; and repeatedly perform the demodulation processing and the decoding processing until the decoding results of the M' code blocks are obtained.

In a possible implementation, the demodulation and decoding module 22 is configured to:

if $M_i$>1, determine $M_i$ bit levels corresponding to the $i^{th}$ code block; and perform parallel demodulation on the $M_i$ bit levels to obtain the LLR of the $i^{th}$ code block.

In a possible implementation, at least two of the M' code blocks have different code lengths.

In a possible implementation, when the modulation scheme is 8-phase shift keying PSK modulation or 8-differential phase shift keying DPSK modulation, M=3, M'=2, a code length of one code block is N, and a code length of another code block is 2N.

In a possible implementation, when the modulation scheme is 16 quadrature amplitude modulation QAM, M=4, M'=3, a code length of two code blocks is N, and a code length of another code block is 2N.

The demodulation and decoding apparatus 20 provided in this embodiment of this application can perform the technical solutions shown in the foregoing method embodiments. Their implementation principles and advantageous effects are similar, and details are not described herein again.

Figure 15:
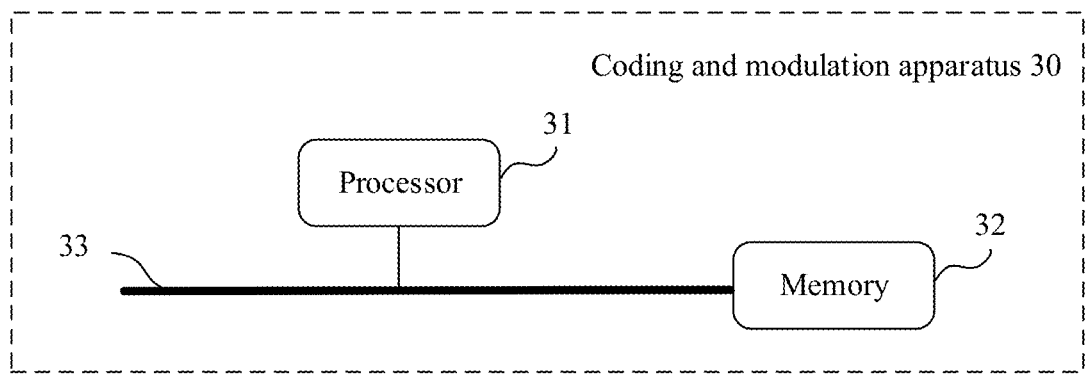
FIG. 15 is a schematic diagram of a hardware structure of a coding and modulation apparatus according to an embodiment of this application.

FIG. 15 is a schematic diagram of a hardware structure of a coding and modulation apparatus 30 according to an embodiment of this application. Refer to FIG. 15. The coding and modulation apparatus 30 may include a processor 31 and a memory 32.

The memory 32 is configured to store a computer program, and sometimes is further configured to store intermediate data.

The processor 31 is configured to execute the computer program stored in the memory, to implement the steps in the foregoing coding and modulation method. For details, refer to the related descriptions in the foregoing method embodiments.

Optionally, the memory 32 may be independent or may be integrated with the processor 31. In some embodiments, the memory 32 may alternatively be located outside the coding and modulation apparatus 30.

When the memory 32 is a component independent of the processor 31, the coding and modulation apparatus 30 may further include a bus 33, configured to connect the memory 32 and the processor 31.

Optionally, the coding and modulation apparatus 30 may further include a receiver and a transmitter. For example, the receiver is configured to obtain to-be-encoded bits, and the transmitter may be configured to output a modulated symbol sequence.

The coding and modulation apparatus 30 provided in this embodiment may be a terminal device or a network device, and may be configured to perform the foregoing coding and modulation method. Implementations and technical effects are similar, and details are not described herein again.

Figure 16:
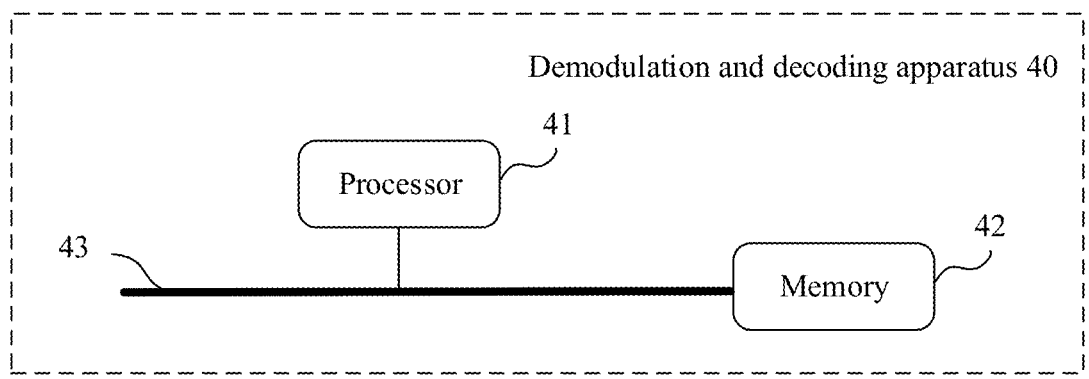
FIG. 16 is a schematic diagram of a hardware structure of a demodulation and decoding apparatus according to an embodiment of this application.

FIG. 16 is a schematic diagram of a hardware structure of a demodulation and decoding apparatus 40 according to an embodiment of this application. Refer to FIG. 16. The demodulation and decoding apparatus 40 may include a processor 41 and a memory 42.

The memory 42 is configured to store a computer program, and sometimes is further configured to store intermediate data.

The processor 41 is configured to execute the computer program stored in the memory, to implement the steps in the foregoing demodulation and decoding method. For details, refer to the related descriptions in the foregoing method embodiments.

Optionally, the memory 42 may be independent, or may be integrated with the processor 41. In some embodiments, the memory 42 may alternatively be located outside the demodulation and decoding apparatus 40.

When the memory 42 is a component independent of the processor 41, the demodulation and decoding apparatus 40 may further include a bus 43, configured to connect the memory 42 and the processor 41.

Optionally, the demodulation and decoding apparatus 40 may further include a receiver. For example, the receiver is configured to obtain a modulated symbol.

The demodulation and decoding apparatus 40 provided in this embodiment may be a terminal device or a network device, and may be configured to perform the foregoing demodulation and decoding method. Implementations and technical effects are similar, and details are not described herein again.

Figure 17:
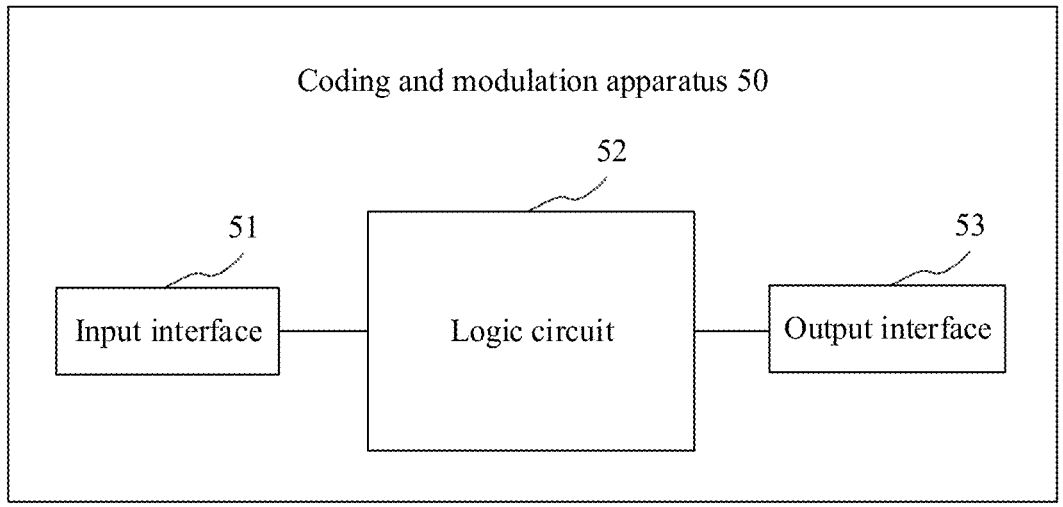
FIG. 17 is a schematic diagram of a structure of still another coding and modulation apparatus according to an embodiment of this application.

FIG. 17 is a schematic diagram of a structure of still another coding and modulation apparatus according to an embodiment of this application. Refer to FIG. 17. The coding and modulation apparatus 50 may include an input interface 51, a logic circuit 52, and an output interface 53.

The input interface 51 is configured to obtain K to-be-encoded bits and a modulation scheme, where K is an integer greater than or equal to 1.

The logic circuit 52 is configured to encode the K to-be-encoded bits based on M bit levels of the modulation scheme, to obtain M' code blocks, modulate the M' code blocks according to a mapping relationship between the M' code blocks and the M bit levels, to obtain a modulated symbol sequence, where M'<M, a code length of an $i^{th}$ code block is $N_i$, and $N_i=M_i*N$, $M_i$ is a quantity of bit levels corresponding to the $i^{th}$ code block, N is a symbol block length, i is an integer from 1 to M', and $\Sigma_{i=1}^{i=M'}(M_i)=M$; a quantity of information bits included in the $i^{th}$ code block is $K_i$, $\Sigma_{i=1}^{i=M'}(K_i)=K$; M, M', N, $N_i$, $M_i$, and $K_i$ are all positive integers; a code block whose code length is $M_i*N$ corresponds to $M_i$ bit levels in the mapping relationship.

The output interface 53 is configured to output the modulated symbol sequence.

Optionally, the input interface 51 may have a function of the obtaining module 11 in the embodiments shown in FIG. 12 to FIG. 13. The logic circuit 52 may have functions of the coding module 12 and the modulation module 13 in the embodiments shown in FIG. 12 to FIG. 13. The output interface 53 may have a function of the output module 14 in the embodiments shown in FIG. 12 to FIG. 13.

Optionally, the input interface 51 may have a function of the receiver in the embodiment shown in FIG. 15. The logic circuit 52 may have a function of the processor 31 in the embodiment shown in FIG. 15. The output interface 53 may have a function of the transmitter in the embodiment shown in FIG. 15.

Optionally, the logic circuit 52 may further perform other steps in the coding and modulation method. For example, the logic circuit 52 may further perform steps described in S302 to S303 in the embodiment shown in FIG. 3.

The coding and modulation apparatus 50 provided in this embodiment of this application can perform the technical solutions shown in the foregoing method embodiments. Their implementation principles and advantageous effects are similar, and details are not described herein again.

Figure 18:
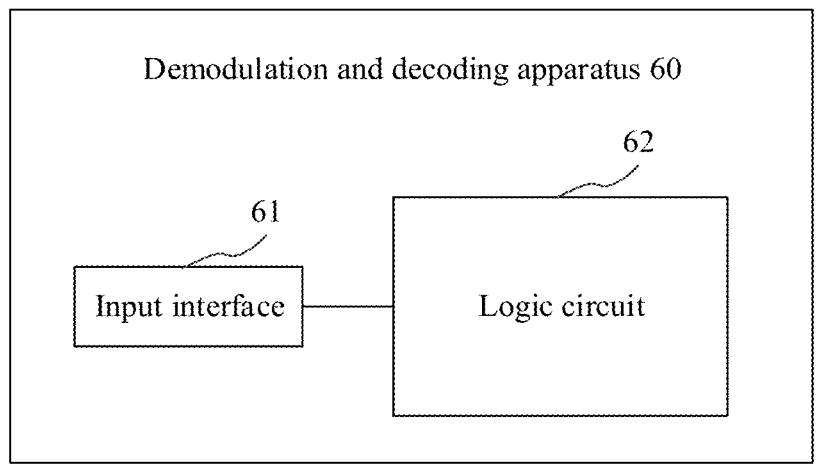
FIG. 18 is a schematic diagram of a structure of still another demodulation and decoding apparatus according to an embodiment of this application.

FIG. 18 is a schematic diagram of a structure of still another demodulation and decoding apparatus according to an embodiment of this application. Refer to FIG. 18. The demodulation and decoding apparatus 60 may include an input interface 61 and a logic circuit 62.

The input interface 61 is configured to obtain N modulated symbols corresponding to M' code blocks, where M'<M, M is a quantity of bit levels of a modulation scheme, N is a symbol block length, a code length of an $i^{th}$ code block is $N_i$, $N_i=M_i*N$, $M_i$ is a quantity of bit levels corresponding to the $i^{th}$ code block, i is an integer from 1 to M', $\Sigma_{i=1}^{i=M'}(M_i)=M$; M, M', N, $N_i$, and $M_i$ are all positive integers.

The logic circuit 62 is configured to sequentially demodulate and decode the M' code blocks based on the N modulated symbols, to obtain decoding results of the M' code blocks.

Optionally, the demodulation and decoding apparatus 60 may further include an output interface. For example, the output interface may output a decoding result.

Optionally, the input interface 61 may have a function of the obtaining module 21 in the embodiment shown in FIG. 14. The logic circuit 62 may have a function of the demodulation and decoding module 22 in the embodiment shown in FIG. 14.

Optionally, the input interface 61 may have a function of the receiver in the embodiment shown in FIG. 16. The logic circuit 62 may have a function of the processor 41 in the embodiment shown in FIG. 16.

Optionally, the logic circuit 62 may further perform other steps in the demodulation and decoding method. For example, the logic circuit 62 may further perform the steps described in S402 in the embodiment shown in FIG. 4.

The demodulation and decoding apparatus 60 provided in this embodiment of this application can perform the technical solutions shown in the foregoing method embodiments. Their implementation principles and advantageous effects are similar, and details are not described herein again.

An embodiment of this application further provides a storage medium, where the storage medium includes a computer program, and the computer program is used to implement the foregoing coding and modulation method.

An embodiment of this application further provides a storage medium, where the storage medium includes a computer program, and the computer program is used to implement the foregoing demodulation and decoding method.

An embodiment of this application further provides a chip or an integrated circuit, including a memory and a processor.

The memory is configured to store program instructions, and sometimes is further configured to store intermediate data.

The processor is configured to invoke the program instructions stored in the memory, to implement the foregoing coding and modulation method.

Optionally, the memory may be independent, or may be integrated with the processor.

In some implementations, the memory may alternatively be located outside the chip or the integrated circuit.

An embodiment of this application further provides a chip or an integrated circuit, including a memory and a processor.

The memory is configured to store program instructions, and sometimes is further configured to store intermediate data.

The processor is configured to invoke the program instructions stored in the memory, to implement the foregoing demodulation and decoding method.

Optionally, the memory may be independent, or may be integrated with the processor. In some implementations, the memory may alternatively be located outside the chip or the integrated circuit.

An embodiment of this application further provides a program product. The program product includes a computer program, the computer program is stored in a storage medium, and the computer program is configured to implement the foregoing coding and modulation method.

An embodiment of this application further provides a program product. The program product includes a computer program, the computer program is stored in a storage medium, and the computer program is configured to implement the foregoing demodulation and decoding method.

Methods or algorithm steps described in combination with the content disclosed in this embodiment of the present invention may be implemented by hardware, or may be implemented by a processor by executing a software instruction. The software instruction may include a corresponding software module. The software module may be stored in a random access memory (RAM), a flash memory, a read-only memory (ROM), an erasable programmable read only memory (EPROM), an electrically erasable programmable read only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium or write information into the storage medium. Certainly, the storage medium may be a component of the processor. The processor and the storage medium may be located in the ASIC. In addition, the ASIC may be located in a base station or a terminal. Certainly, the processor and the storage medium may exist in the receiving device as discrete components.

It should be understood that the processor may be a central processing unit (CPU), or may be another general-purpose processor, a digital signal processor (DSP), an application-specific integrated circuit (ASIC), or the like. The general purpose processor may be a microprocessor, or the processor may be any conventional processor or the like. The steps of the method disclosed with reference to the present invention may be directly performed by a hardware processor, or may be performed by using a combination of hardware in the processor and a software module.

The memory may include a high-speed RAM memory, and may further include a non-volatile memory NVM, for example, at least one magnetic disk memory, or may be a USB flash drive, a removable hard disk, a read-only memory, a magnetic disk, an optical disc, or the like.

The bus may be an industry standard architecture (ISA) bus, a peripheral component interconnect (PCI) bus, an extended industry standard architecture (EISA) bus, or the like. The bus may be classified into an address bus, a data bus, a control bus, and the like. For ease of representation, the bus in the accompanying drawings of this application is not limited to only one bus or only one type of bus.

The storage medium may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium accessible to a general-purpose or dedicated computer.

In this application, "at least one" means one or more, and "a plurality of" means two or more. The term "and/or" describes an association relationship between associated objects and represents that three relationships may exist. For example, A and/or B may represent the following cases: Only A exists, both A and B exist, and only B exists, where A and B may be singular or plural. The character "/" generally indicates an "or" relationship between the associated objects. "At least one of the following items (pieces)" or a similar expression means any combination of these items, including any combination of singular items (pieces) or plural items (pieces). For example, at least one item (piece) of a, b, or c may represent: a, b, c, a and b, a and c, b and c, or a, b, and c, where a, b, and c may be singular or plural.

A person skilled in the art should be aware that in the foregoing one or more examples, functions described in the embodiments of the present invention may be implemented by hardware, software, firmware, or any combination thereof. When the present invention is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

In the several embodiments provided in the present invention, it should be understood that the disclosed device and method may be implemented in other manners. For example, the described device embodiment is merely an example. For example, the module division is merely logical function division and may be other division in actual implementation. For example, a plurality of modules may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

The modules described as separate parts may or may not be physically separate, and parts displayed as modules may or may not be physical units, may be located in one position, or may be distributed on a plurality of network units. Some or all the modules may be selected according to actual needs to achieve the objectives of the solutions of the embodiments.

In addition, functional modules in the embodiments of the present invention may be integrated into one processing unit, or each of the modules may exist alone physically, or two or more modules are integrated into one module. The units formed by the foregoing modules may be implemented in a form of hardware, or may be implemented in a form of hardware in addition to a software functional unit.

What is claimed is:

1. A coding and modulating method implemented by a coding and modulating apparatus in a communication system, comprising:

obtaining, by the coding and modulating apparatus, K to-be-encoded bits and a modulation scheme, wherein K is an integer greater than or equal to 1;

encoding, by the coding and modulating apparatus, the K to-be-encoded bits, based on M bit levels of the modulation scheme, to obtain M' code blocks, wherein M'<M, a code length of an $i^{th}$ code block is $N_i$, and $N_i = M_i * N$, wherein $M_i$ is a quantity of bit levels corresponding to the $i^{th}$ code block, N is a symbol block length, i is an integer from 1 to M', and $\Sigma_{i=1}^{i=M'}(M_i)=M$, and wherein a quantity of information bits comprised in the $i^{th}$ code block is $K_i$, $\Sigma_{i=1}^{i=M'}(K_i)=K$, and M, M', N, $N_i$, $M_i$, and $K_i$ are all positive integers;

modulating, by the coding and modulating apparatus, the M' code blocks, according to a mapping relationship between the code blocks and the M bit levels, to obtain a modulated symbol sequence, wherein a code block having a code length of $M_i * N$ corresponds to $M_i$ bit levels in the mapping relationship; and sending, by the coding and modulating apparatus, the modulated symbol sequence to a receiving device in the communication system via a communication channel between the coding and modulating apparatus and the receiving device.

2. The method according to claim 1, wherein at least two of the M' code blocks have different code lengths.

3. The method according to claim 1, wherein an absolute value of a bit-level capacity difference between the $M_i$ bit levels to which the code block having the code length of $M_i * N$ is mapped is less than or equal to a preset difference.

4. The method according to claim 1, wherein the encoding the K to-be-encoded bits based on the M bit levels of the modulation scheme comprises:

classifying the K to-be-encoded bits into M' to-be-encoded sequences based on bit-level capacities of the M bit levels; and separately encoding the M' to-be-encoded sequences to obtain the M' code blocks.

5. The method according to claim 4, wherein the classifying the K to-be-encoded bits into the M' to-be-encoded sequences based on the bit-level capacities of the M bit levels comprises:

classifying the M bit levels into M' groups of bit levels, wherein each group of bit levels comprises at least one bit level; and classifying the K to-be-encoded bits into the M' to-be-encoded sequences based on N, a quantity of bit levels comprised in each group of bit levels, and a bit-level capacity of each bit level in each group of bit levels.

6. The method according to claim 1, wherein the modulating the M' code blocks according to the mapping relationship between the M' code blocks and the M bit levels comprises:

for any $i^{th}$ code block, when $M_i$ is equal to 1, mapping the $i^{th}$ code block to an $i^{th}$ group of bit levels in a constellation diagram; and for any $i^{th}$ code block, when $M_i$ is greater than 1, converting the $i^{th}$ code block into $M_i$ bit streams, and separately mapping the $M_i$ bit streams to the $i^{th}$ group of bit levels in the constellation diagram, wherein a length of each bit stream is N, and one bit stream is mapped to one bit level of the $i^{th}$ group of bit levels.

7. The method according to claim 6, wherein a difference between bit-level capacities of bit levels in the $i^{th}$ group of bit levels is less than or equal to a preset difference.

8. The method according to claim 6, wherein before the converting the $i^{th}$ code block into the $M_i$ bit streams, the method further comprises:

performing interleaving processing on the $i^{th}$ code block.

9. The method according to claim 1, wherein when the modulation scheme is 8-phase shift keying (PSK) modulation or 8-differential phase shift keying (DPSK) modulation, M=3, M'=2, a code length of one code block is N, and a code length of another code block is 2N.

10. The method according to claim 1, wherein when the modulation scheme is 16 quadrature amplitude modulation (QAM), M=4, M'=3, a code length of two code blocks is N, and a code length of another code block is 2N.

11. A coding and modulation apparatus, comprising:

at least one non-transitory memory, configured to store program instructions;

an input interface configured to obtain K to-be-encoded bits and a modulation scheme, wherein K is an integer greater than or equal to 1;

at least one processor coupled to the receiver and the at least one non-transitory memory, wherein when executing the program instructions, the at least one processor is configured to:

encode the K to-be-encoded bits based on M bit levels of the modulation scheme, to obtain M' code blocks, wherein M'<M, a code length of an $i^{th}$ code block is $N_i$, and $N_i = M_i * N$, wherein $M_i$ is a quantity of bit levels corresponding to the $i^{th}$ code block, N is a symbol block length, i is an integer from 1 to M', and $\Sigma_{i=1}^{i=M'}(M_i)=M$, and wherein a quantity of information bits comprised in the $i^{th}$ code block is $K_i$, $\Sigma_{i=1}^{i=M'}(K_i)=K$, and M, M', N, $N_i$, $M_i$, and $K_i$ are all positive integers; and modulate the M' code blocks according to a mapping relationship between the M' code blocks and the M bit levels, to obtain a modulated symbol sequence, wherein a code block having a code length of $M_i * N$ corresponds to $M_i$ bit levels in the mapping relationship; and an output interface coupled to the at least one processor and configured to output the modulated symbol sequence.

12. The apparatus according to claim 11, wherein at least two of the M' code blocks have different code lengths.

13. The apparatus according to claim 11, wherein an absolute value of a bit-level capacity difference between the $M_i$ bit levels to which the code block having the code length of $M_i * N$ is mapped is less than or equal to a preset difference.

14. The apparatus according to claim 11, wherein the at least one processor is further configured to:

classify the K to-be-encoded bits into M' to-be-encoded sequences based on bit-level capacities of the M bit levels; and separately encode the M' to-be-encoded sequences to obtain the M' code blocks.

15. The apparatus according to claim 14, wherein the at least one processor is further configured to:

classify the M bit levels into M' groups of bit levels, wherein each group of bit levels comprises at least one bit level; and classify the K to-be-encoded bits into the M' to-be-encoded sequences based on N, a quantity of bit levels comprised in each group of bit levels, and a bit-level capacity of each bit level in each group of bit levels.

16. The apparatus according to claim 11, wherein the at least one processor is further configured to:

for any $i^{th}$ code block, when $M_i$ is equal to 1, map the $i^{th}$ code block to an $i^{th}$ group of bit levels in a constellation diagram; and for any $i^{th}$ code block, when $M_i$ is greater than 1, convert the $i^{th}$ code block into $M_i$ bit streams, and separately map the $M_i$ bit streams to the $i^{th}$ group of bit levels in the constellation diagram, wherein a length of each bit stream is N; and one bit stream is mapped to one bit level of the $i^{th}$ group of bit levels.

17. The apparatus according to claim 16, wherein a difference between bit-level capacities of bit levels in the $i^{th}$ group of bit levels is less than or equal to a preset difference.

18. The apparatus according to claim 16, wherein the at least one processor is further configured to: before the modulation module converts the $i^{th}$ code block into the $M_i$ bit streams, perform interleaving processing on the $i^{th}$ code block.

19. A demodulating and decoding apparatus, comprising:
at least one non-transitory memory, configured to store program instructions;
an input interface configured to
obtain N modulated symbols corresponding to M' code blocks, wherein M'≤M, M is a quantity of bit levels of a modulation scheme, N is a symbol block length, a code length of an $i^{th}$ code block is $N_i$, $N=M_i*N$, $M_i$ is a quantity of bit levels corresponding to the $i^{th}$ code block, i is an integer from 1 to M', $\Sigma_{i=1}^{i=M'}(M_i)=M$, and M, M', N, $N_i$, and $M_i$ are all positive integers; and at least one processor coupled to the at least one non-transitory memory and the receiver, wherein when executing the program instructions, the at least one processor is configured to:
sequentially demodulate and decode the M' code blocks based on the N modulated symbols, to obtain decoding results of the M' code blocks.

20. The apparatus according to claim 19, wherein the at least one processor is further configured to:
perform demodulation processing on the $i^{th}$ code block, wherein the demodulation processing comprises adding 1 to i, and determining an LLR of the $i^{th}$ code block based on decoding results of first (i−1) code blocks and the N modulated symbols, and wherein an initial value of i is 0;
perform decoding processing on the $i^{th}$ code block, wherein the decoding processing comprises determining a decoding result of the $i^{th}$ code block based on the LLR of the $i^{th}$ code block; and
repeatedly perform the demodulation processing and the decoding processing until the decoding results of the M' code blocks are obtained.

* * * * *